United States Patent
Soejima et al.

(10) Patent No.: US 7,735,028 B2
(45) Date of Patent: Jun. 8, 2010

(54) LOGIC CIRCUIT REDESIGN PROGRAM, LOGIC CIRCUIT REDESIGN APPARATUS, AND LOGIC CIRCUIT REDESIGN METHOD

(75) Inventors: Yoshinori Soejima, Fukuoka (JP); Yoshikatsu Kouhara, Fukuoka (JP); Hiroaki Shiraishi, Fukuoka (JP); Kouichi Tanda, Fukuoka (JP); Takakazu Tokunaga, Fukuoka (JP); Koji Takatomi, Fukuoka (JP)

(73) Assignee: Fujitsu Limited, Kawasaki (JP)

( * ) Notice: Subject to any disclaimer, the term of this patent is extended or adjusted under 35 U.S.C. 154(b) by 451 days.

(21) Appl. No.: 11/902,050

(22) Filed: Sep. 18, 2007

(65) Prior Publication Data

US 2008/0077904 A1    Mar. 27, 2008

(30) Foreign Application Priority Data

Sep. 25, 2006 (JP) .............................. 2006-259733

(51) Int. Cl.
*G06F 17/50* (2006.01)
(52) U.S. Cl. .............................. 716/1; 716/12; 716/16; 716/18
(58) Field of Classification Search ............... 716/1, 716/12–18
See application file for complete search history.

(56) References Cited

U.S. PATENT DOCUMENTS

2007/0174794 A1* 7/2007 Oktem et al. ................. 716/1

FOREIGN PATENT DOCUMENTS

| JP | 8-30653 | 2/1996 |
| JP | 11-73440 | 3/1999 |

* cited by examiner

*Primary Examiner*—Paul Dinh
(74) *Attorney, Agent, or Firm*—Staas & Halsey LLP

(57) ABSTRACT

A computer is allowed to execute an information acquisition process that acquires a file expressing information on pins used in respective ports provided in each block of a logic circuit to be redesigned and information indicating connection relationships between the ports (#2); execute a multiplexer disposition process that, based on the file, classifies pins of output ports of a block into a number of pin groups that is less than the number of pins, and disposes a multiplexer having a function to multiplex a signal output from each pin classified in the same pin group (#11, #13); and execute a demultiplexer disposition process that, based on that file, disposes a demultiplexer having a function to demultiplex signals that have been output from output ports of a block and multiplexed by the multiplexer, and a function to output each demultiplexed signal to input ports of respective input destination blocks (#12, #13).

8 Claims, 23 Drawing Sheets

FIG. 4A

FUNC1 — 801(80)

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP | |
|---|---|---|---|---|---|---|---|---|---|---|
| 1 | CLK | 1 | I | S | CLK | – | I/O | CLK1 | | R0 |
| 2 | F1_IDTA | 3:0 | I | V | DT | CLK | I/O | IDTA[3:0] | | R0 |
| 3 | F1_IODTA | 15:0 | I | V | DT | CLK | | | 1 | R0 |
| 4 | F1_ODTB | 1:0 | O | V | DT | CLK | | | 1 | R0 |

FIG. 4B

FUNC2 — 802(80)

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP | |
|---|---|---|---|---|---|---|---|---|---|---|
| 1 | CLK | 1 | I | S | CLK | – | I/O | CLK1 | | R0 |
| 2 | F2_IDTA | 3:0 | I | V | DT | CLK | FUNC3 | F3_ODTB[3:0] | | R0 |
| 3 | F2_IDTB | 15:0 | I | V | DT | CLK | I/O | IDTB[15:0] | | R0 |
| 4 | F2_IDTC | 31:0 | I | V | DT | CLK | I/O | IDTC[31:0] | | R0 |
| 5 | F2_ODTA | 6:0 | O | V | DT | CLK | | | 1 | R0 |
| 6 | F2_ODTB | 3:0 | O | V | DT | CLK | I/O | ODTC[3:0] | 1 | R0 |
| 7 | F2_ODTC | 15:0 | O | V | DT | CLK | | | 1 | R0 |
| 8 | F2_ODTD | 15:0 | O | V | DT | CLK | | | 1 | R0 |

FIG. 4C

FUNC3 — 803(80)

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP | |
|---|---|---|---|---|---|---|---|---|---|---|
| 1 | CLK | 1 | I | S | CLK | – | I/O | CLK1 | | R0 |
| 2 | F3_IDTA | 15:0 | I | V | DT | CLK | FUNC1 | F1_ODTA[15:0] | | R0 |
| 3 | F3_IDTB | 1:0 | I | V | DT | CLK | FUNC1 | F1_ODTB[1:0] | | R0 |
| 4 | F3_IDTC | 6:0 | I | V | DT | CLK | FUNC2 | F2_ODTA[6:0] | | R0 |
| 5 | F3_ODTA | 15:0 | O | V | DT | CLK | I/O | ODTA[15:0] | 1 | R0 |
| 6 | F3_ODTB | 3:0 | O | V | DT | CLK | I/O | ODTB[3:0] | 1 | R0 |

FUNC4

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP |
|---|---|---|---|---|---|---|---|---|---|
| 1 | CLK | 1 | I | S | CLK | - | I/O | CLK2 | |
| 2 | F4_IDTA | 15:0 | I | V | DT | CLK | FUNC2 | F2_ODTD[15:0] | |
| 3 | F4_IDTB | 3:0 | I | V | DT | CLK | I/O | IDTD[3:0] | |
| 4 | F4_IDTC | 3:0 | I | V | DT | CLK | FUNC6 | F6_ODTB[3:0] | |
| 5 | F4_ODTA | 31:0 | O | V | DT | CLK | | | 1 |
| 6 | F4_ODTB | 1 | O | S | DT | CLK | | | 1 |

FUNC5

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP |
|---|---|---|---|---|---|---|---|---|---|
| 1 | CLK | 1 | I | S | CLK | - | I/O | CLK2 | |
| 2 | F5_IDTA | 15:0 | I | V | DT | CLK | FUNC2 | F2_ODTC[15:0] | |
| 3 | F5_IDTB | 31:0 | I | S | DT | CLK | FUNC4 | F4_ODTA[31:0] | |
| 4 | F5_ODTA | 5:0 | O | V | DT | CLK | I/O | ODTD[5:0] | |
| 5 | F5_ODTB | 31:0 | O | V | DT | CLK | | | 1 |

FUNC6

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP |
|---|---|---|---|---|---|---|---|---|---|
| 1 | CLK | 1 | I | S | CLK | - | I/O | CLK2 | |
| 2 | F6_IDTA | 31:0 | I | V | DT | CLK | FUNC5 | F5_ODTB[31:0] | |
| 3 | F6_IDTB | 1 | I | S | DT | CLK | FUNC4 | F4_ODTB | |
| 4 | F6_ODTA | 5:0 | O | V | DT | CLK | I/O | ODTE[5:0] | |
| 5 | F6_ODTB | 3:0 | O | V | DT | CLK | | | 1 |

| ITEM | SETTING | DEFAULT VALUE |
|---|---|---|
| 1 | LOGIC DIVISION PROGRAM (0: DO NOT USE, 1: USE) | 0 |
| 2 | MULTIPLEX MODE (0: FIXED MULTIPLEX, 1: OPTIMAL MULTIPLEX) | 0 |
| 3 | MULTIPLEX NUMBER SETTING (SET INTEGER VALUE) ONLY VALID WHEN MULTIPLEX MODE IS FIXED MULTIPLEX | 4 |
| 4 | MULTIPLEX NUMBER SETTING (0: n+1 PATTERN, 1: $2^n$ PATTERN) ONLY VALID WHEN MULTIPLEX MODE IS OPTIMAL MULTIPLEX | 0 |
| 5 | MULTIPLEX ADDING UNCONNECTED CLOCK (0: DO NOT PERFORM, 1: PERFORM) | 0 |
| 6 | JUDGE CONNECTION PARTNER (0: DO NOT PERFORM, 1: PERFORM) | 0 |
| 7 | DUPLICATE MULTIPLEX OF EXTERNAL OUTPUT PIN (0: DO NOT PERFORM, 1: PERFORM) | 0 |
| 8 | MULTIPLEX STRADDLING FUNCTION BLOCK (0: DO NOT PERFORM, 1: PERFORM) | 0 |

| FPGA NUMBER | TARGET BLOCK | MAXIMUM PINS USED |
|---|---|---|
| FPGA1 | FUNC1, FUNC2, FUNC4 | 300 |
| FPGA2 | FUNC3 | 200 |
| FPGA3 | FUNC5, FUNC6 | 200 |

CLK1

| PORT_NAME | RANGE | I/O | TYPE | SIGNAL CLASS | SYNCHRO-NIZATION CLOCK | CONNECTION SOURCE CLASS | CONNECTION SOURCE PORT_NAME | |
|---|---|---|---|---|---|---|---|---|
| F2_ODTB | 3:0 | O | V | DT | CLK | I/O | ODTC[3:0] | ~RA |
| F3_ODTA | 15:0 | O | V | DT | CLK | I/O | ODTA[15:0] | ~RA |
| F3_ODTB | 3:0 | O | V | DT | CLK | I/O | ODTB[3:0] | ~RA |

CLK2

| PORT_NAME | RANGE | I/O | TYPE | SIGNAL CLASS | SYNCHRO-NIZATION CLOCK | CONNECTION SOURCE CLASS | CONNECTION SOURCE PORT_NAME | |
|---|---|---|---|---|---|---|---|---|
| F5_ODTA | 5:0 | O | V | DT | CLK | I/O | ODTD[5:0] | ~RA |
| F6_ODTA | 5:0 | O | V | DT | CLK | I/O | ODTE[5:0] | ~RA |

CLK1

| PORT_NAME | RANGE | I/O | TYPE | SIGNAL CLASS | SYNCHRO-NIZATION CLOCK | CONNECTION SOURCE CLASS | CONNECTION SOURCE PORT_NAME | |
|---|---|---|---|---|---|---|---|---|
| F1_ODTA | 15:0 | O | V | DT | CLK | | | RB |
| F1_ODTB | 1:0 | O | V | DT | CLK | | | RB |
| F2_ODTA | 6:0 | O | V | DT | CLK | | | RB |
| F2_ODTC | 15:0 | O | V | DT | CLK | | | RB |
| F2_ODTD | 15:0 | O | V | DT | CLK | | | RB |
| F3_ODTB | 3:0 | O | V | DT | CLK | I/O | ODTB[3:0] | RB |

CLK2

| PORT_NAME | RANGE | I/O | TYPE | SIGNAL CLASS | SYNCHRO-NIZATION CLOCK | CONNECTION SOURCE CLASS | CONNECTION SOURCE PORT_NAME | |
|---|---|---|---|---|---|---|---|---|
| F4_ODTA | 31:0 | O | V | DT | CLK | | | RB |
| F4_ODTB | 1 | O | S | DT | CLK | | | RB |
| F5_ODTB | 31:0 | O | V | DT | CLK | | | RB |
| F6_ODTB | 3:0 | O | V | DT | CLK | | | RB |

CLK1

| PORT_NAME | RANGE | I/O | TYPE | SIGNAL CLASS | SYNCHRO-NIZATION CLOCK | CONNECTION SOURCE CLASS | CONNECTION SOURCE PORT_NAME | |
|---|---|---|---|---|---|---|---|---|
| F3_IDTA | 15:0 | I | V | DT | CLK | FUNC1 | F1_ODTA[15:0] | RC |
| F3_IDTB | 1:0 | I | V | DT | CLK | FUNC1 | F1_ODTB[1:0] | RC |
| F3_IDTC | 6:0 | I | V | DT | CLK | FUNC2 | F2_ODTA[6:0] | RC |
| F2_IDTA | 3:0 | I | V | DT | CLK | FUNC3 | F3_ODTB[3:0] | RC |

CLK2

| PORT_NAME | RANGE | I/O | TYPE | SIGNAL CLASS | SYNCHRO-NIZATION CLOCK | CONNECTION SOURCE CLASS | CONNECTION SOURCE PORT_NAME | |
|---|---|---|---|---|---|---|---|---|
| F5_IDTA | 15:0 | I | V | DT | CLK | FUNC2 | F2_ODTC[15:0] | RC |
| F4_IDTA | 15:0 | I | V | DT | CLK | FUNC2 | F2_ODTD[15:0] | RC |
| F5_IDTB | 31:0 | I | V | DT | CLK | FUNC4 | F4_ODTA[31:0] | RC |
| F6_IDTB | 1 | I | S | DT | CLK | FUNC4 | F4_ODTB | RC |
| F6_IDTA | 31:0 | I | V | DT | CLK | FUNC5 | F5_ODTB[31:0] | RC |
| F4_IDTC | 3:0 | I | V | DT | CLK | FUNC6 | F6_ODTB[3:0] | RC |

FIG. 22

FUNC1

801(80)

| ITEM | PORT_NAME | RANGE | I/O | TYPE | SIGNAL CLASS | SYNCHRO-NIZATION CLOCK | CONNECTION SOURCE CLASS | CONNECTION SOURCE PORT_NAME | MULTIPLEX GROUP |
|---|---|---|---|---|---|---|---|---|---|
| 1 | CLK | 1 | I | S | CLK | – | | | |
| 2 | F1_IDTA | 3:0 | I | V | DT | CLK | I/O | CLK1 | |
| 3 | F1_ODTA | 15:0 | O | V | DT | CLK | I/O | IDTA[3:0] | 2 |
| 4 | F1_ODTB | 1:0 | O | V | DT | CLK | | | 1 |

LOGIC CIRCUIT REDESIGN PROGRAM, LOGIC CIRCUIT REDESIGN APPARATUS, AND LOGIC CIRCUIT REDESIGN METHOD

BACKGROUND OF THE INVENTION

1. Field of the Invention

The present invention relates to a computer program, apparatus, and method for redesigning a logic circuit.

2. Description of the Related Art

Conventionally, FPGAs (Field Programmable Gate Arrays) are used in the development of an LSI (Large Scale Integrated Circuit) such as an ASIC (Application Specific Integrated Circuit). By using FPGAs, it is possible for the developer to redesign a function any number of times to redefine a logic circuit.

When creating a prototype for a large-scale logic circuit, the logic circuit is divided into a plurality of FPGAs or the like. Thus, it is possible to conveniently realize a logic circuit equivalent to the original logic circuit. At this time, it is desirable to divide the logic circuit into FPGAs for each of one or a plurality of specific functions. Doing so is effective, because it is thus possible to perform work such as verification and debugging of the operation of each of the one or a plurality of specific functions.

However, with the above method, although there is no problem in terms of capacity, often the number of pins is insufficient. So, elimination of pin necks is sought.

The methods described in Japanese unexamined patent publication Nos. 11-73440 and 8-30653 are both methods for eliminating pin necks. However, with these methods, it is not possible to eliminate pin necks when the logic circuit is divided into a plurality of FPGAs or the like.

SUMMARY

The present invention was made in view of such problems, and it is an object thereof to achieve elimination of pin necks when a logic circuit is divided into a plurality of FPGAs or the like and is redesigned.

According to one aspect of the present invention, a logic circuit redesign program used for a computer that performs redesign of a logic circuit comprising a plurality of blocks. The logic circuit redesign program allows the computer to execute an information acquisition process that acquires pin information related to pins used in respective ports provided in each of the blocks and connection information that indicates connection relationships between the ports, execute a multiplexer disposition process that, based on the pin information and the connection information, classifies a plurality of pins of output ports of a block into a number of pin groups that is less than the number of pins, and disposes a multiplexer having a function to multiplex a signal output from each pin classified in the same pin group, and execute a demultiplexer disposition process that, based on the pin information and the connection information, disposes a demultiplexer having a function to demultiplex signals that have been output from output ports of a block and multiplexed by the multiplexer, and a function to output each of the demultiplexed signals to input ports of respective input destination blocks.

Preferably, the logic circuit redesign program may allow the computer to execute the multiplexer disposition process such that, when the signals output from the respective pins of the plurality of output ports are multiplexed by a single multiplexer, multiplexing is performed by the multiplexer on the signals output from the pins of the output ports that have the same input destination block of the signals output.

Further, the logic circuit redesign program may allow the computer to execute a block classification process that classifies each block under any of a plurality of FPGAs (Field Programmable Gate Arrays), and allow the computer to execute the multiplexer disposition process such that multiplexing is performed by the multiplexer only on signals output from the pins of the output ports of a block of an FPGA different than the FPGA of the input destination block of the signals output.

According to the invention, it is possible to eliminate pin necks when a logic circuit is divided into a plurality of FPGAs or the like and is redesigned.

BRIEF DESCRIPTION OF THE DRAWINGS

FIG. 4 shows an example of a pin information table included in a pin information file.

FIG. 5 shows an example of a pin information table included in a pin information file.

FIG. 6 shows an example of items of settings information included in a settings file.

FIG. 7 shows an example of a settings file.

FIG. 8 shows an example of an external connection multiplex database.

FIG. 9 shows an example of an internal connection multiplex database.

FIG. 11 shows an example of a demultiplex database.

FIG. 22 shows a modified example of a pin information table.

DESCRIPTION OF THE PREFERRED EMBODIMENTS

Figure 1A:
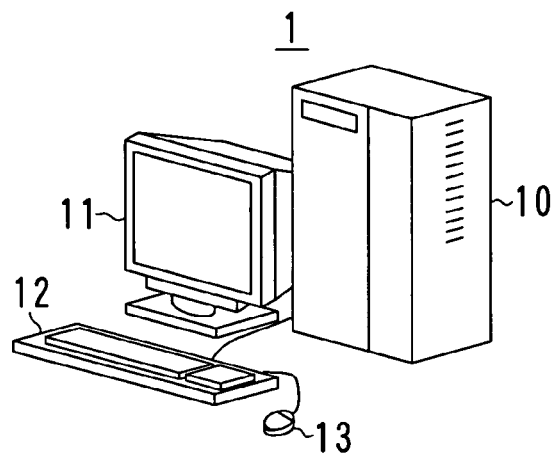
FIG. 1 shows an example of the overall configuration of a computer and the hardware configuration of a computer body.

A computer 1 shown in FIG. 1A is configured from a computer body 10, a display 11, a keyboard 12, a mouse 13, and the like. A personal computer, a workstation, or the like is used as the computer 1.

Figure 1B:
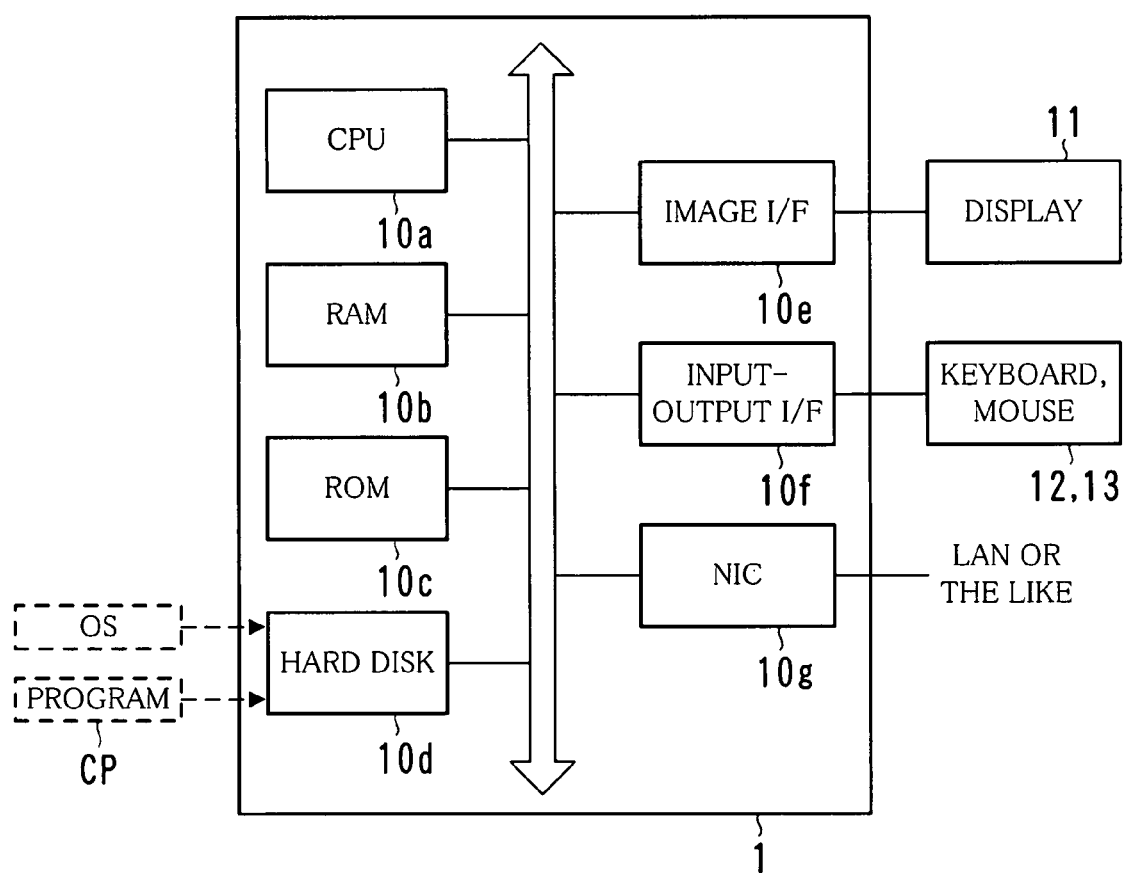

As shown in FIG. 1B, the computer body 10 is configured from a CPU 10a, a RAM 10b, a ROM 10c, a hard disk 10d, an image interface 10e, an input-output interface 10f, a network card 10g, and the like.

The image interface 10e is an interface for connecting to the display 11, and sends a video signal for displaying an image to the display 11. The input-output interface 10f is used to connect to the keyboard 12 and the mouse 13, and a signal of a user's operation is input from the keyboard 12 and the mouse 13. The network card 10g is a NIC (Network Interface Card) for connecting to a LAN, the Internet, or the like.

Installed on the hard disk 10d is, in addition to an operating system, a computer program CP according to the invention. The computer program CP is a computer program for realizing the functions of, for example, as shown in FIG. 2, a data management portion 20B, a logic circuit data input portion 201, a settings information receiving portion 202, a settings information verification portion 203, a message notification portion 204, a tentative synthesis portion 205, a multiplex database creation portion 206, a demultiplex database creation portion 207, a logic circuit configuration process portion 208, and a results file output portion 209.

With the computer program CP, it is possible to convert (redesign) a designed ASIC (Application Specific Integrated Circuit) into an ASIC configured from a plurality of FPGAs (Field Programmable Gate Arrays). Moreover, at that time, it is possible to reduce the number of pins used in the ASIC in comparison to the case of conversion with a conventional method.

The program and data are loaded in the RAM 10b as necessary, and the program is executed by the CPU 10a.

Figure 2:
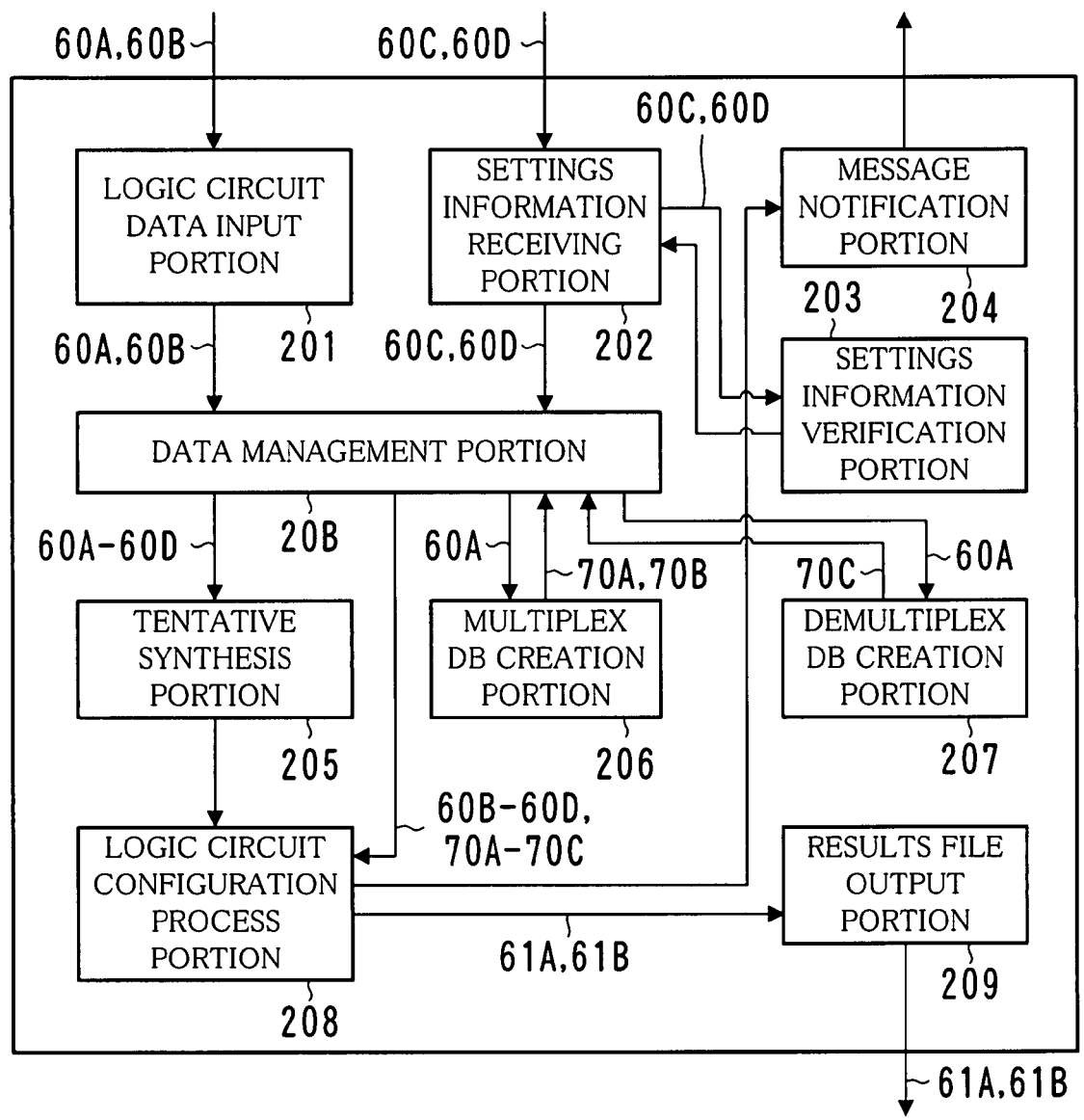
FIG. 2 shows an example of the functional configuration of the computer.
Figure 3:
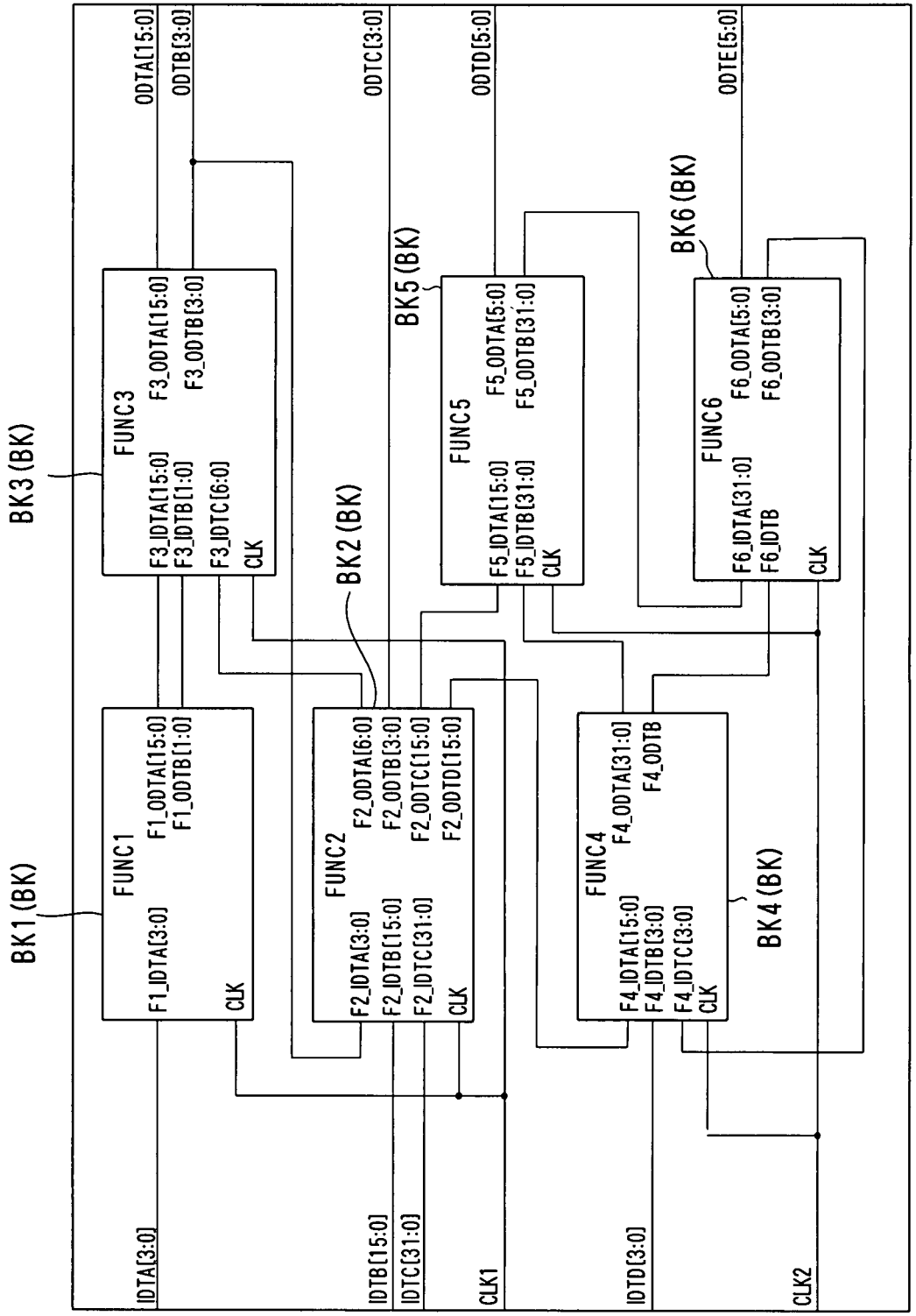
FIG. 3 shows an example of an existing ASIC.

Below, the processing content of each portion in FIG. 2 is described, taking as an example a case in which an ASIC configured from, as shown in FIG. 3, six functional blocks BK (BK1, BK2, ..., BK6) that respectively have function names "FUNC1", "FUNC2", ..., "FUNC6", a plurality of ports (terminals) for inputting a signal from outside the ASIC, a plurality of ports for outputting a signal to outside the ASIC, and the like, is converted to an ASIC configured from a plurality of FPGAs. The ports for inputting a signal from outside the ASIC, and the ports for outputting a signal to outside the ASIC, are respectively referred to as "external input ports" and "external output ports". The function names are also used as the names of the blocks BK (block names).

In FIG. 3, the ports that respectively have the names "IDTA", "IDTB", ..., "CLK2" shown on the left are external input ports. On the other hand, the ports that respectively have the names "ODTA", "ODTB", ..., "ODTE" shown on the right are external output ports.

Also, information expressed in the format "[x:0]" may be added beside the name of each external input port and external output port. This indicates the range and number of pins used by that port. More specifically, that information means that the port uses pin numbers "0" to "x", i.e., that the port uses the number of pins (x+1). For example, "[3:0]" means that the port uses pin numbers "0" to "3", i.e., that the port uses four pins.

However, when the number of pins is one, the addition of that information is omitted. In the other drawings, "[x:0]" added beside the name of each port constituting the block BK has the same meaning. Also, the pin number is a local number that distinguishes between pins used in a single port. Accordingly, the first pin of one port is not the same as the first pin of another port; they differ.

Below, such information related to the range and number of pins used by a port is referred to as "used pin information".

In FIG. 2, the data management portion 20B stores and manages data acquired by the processes of the logic circuit data input portion 201, the settings information receiving portion 202, the multiplex database creation portion 206, the demultiplex database creation portion 207, and the logic circuit configuration process portion 208, which are described in order below.

The data of the logic circuit for which the processes are performed, i.e., the ASIC in FIG. 3, is input to the logic circuit data input portion 201, and the logic circuit data input portion 201 causes that data to be stored in the data management portion 20B. Specifically, a pin information file 60A and an RTL file 60B are input to the logic circuit data input portion 201.

The pin information file 60A is constituted from, for example, a pin information table 80 (801, 802, ..., 806) for each block BK as shown in FIGS. 4 and 5. Information related to the pins of each port of the corresponding block BK and the like is stored in the pin information table 80. For example, information related to the pins of each port of the block BK of the function "FUNC1", i.e., the block BK1, and the like is stored in the pin information table 801 in FIG. 4A.

A record is provided in the pin information table 80 for each port of the block BK corresponding to that pin information table 80. One record is made up of 10 fields from an "item" field to a "multiplex group" field. Below, a record provided in the pin information table 80 is referred to as a "record RO".

The "item" field shows a number for distinguishing that record RO from other records RO. The "Port_name" field shows the name of the port for that record.

A "range" field shows the used pin information for that port, i.e., the range and number of pins used by that port. The format of the "range" field is the same as in the case of the above-described external input ports and external output ports. However, when that port uses only one pin, "1" is shown in the range field.

An "I/O" field indicates whether that port is a port for inputting a signal to its own block BK (below, referred to as an "input port"), or is a port for outputting a signal to another block BK or an external output port (below, referred to as an "output port"). "I" indicates that the port is an input port, and "O" indicates that the port is an output port.

A "type" field indicates whether or not that port uses a plurality of pins. "S" indicates that the port uses only one pin, and "V" indicates that the port uses a plurality of pins.

A "signal class" field indicates the type of signal that is input to that port or output from that port. "CLK" indicates that the signal input to that port is a clock signal, and "DT" indicates that the signal input to that port or output from that port is a data signal.

A "synchronization clock" field indicates the name (Port_name) of an input port to which the clock signal used by that port is input.

A "connection source class" field and a "connection source Port_name" field indicate a connection partner (a port to which the port of that record is connected). Specifically, the "connection source class" field indicates the type of the connection partner. For example, when the port of that record is connected to any of the output ports of another block BK, the block name of that other block BK (the function name of the function that corresponds to that other block BK) is indicated, and in the case of an external input port or an external output port, a character string "I/O" is shown. On the other hand, in the "connection source Port_name" field, the name (Port_name) and the used pin information (range) of the connection partner are indicated. When the number of pins used is "1", the used pin information is omitted.

However, in the examples shown in FIGS. 4 and 5, when two ports that are neither an external input port or an external output port (for example, an output port of one block BK and an input port of another block BK) are connected, information of the connection partner is stored only in the "connection source class" field and the "connection source Port_name"

field of the record RO of the input-side port, i.e., the input port, and both of those fields are left empty in the record RO of the output-side port, i.e., the output port. For example, as shown in FIG. 3, a port "F3_IDTB" (input port) of the block BK3 and a port "F1_ODTB" (output port) of the block BK1 are connected to each other, and in this case, as in the third record RO in FIG. 4C and the fourth record RO in FIG. 4A, information of the connection partner is stored only in the record RO of the input port, and storage of information to both fields of the record RO of the output port is omitted.

The "multiplex group" field shows identification information (below, referred to as a "multiplex group number") of a group when a pin multiplex process is performed (below, referred to as a "multiplex group"). The method for using the information of this field will be described later. Also note that when that port is not a candidate for the pin multiplex process, the fields for that part are empty.

On the other hand, information related to circuit design described in RTL (Register Transfer Level) for each of the blocks BK of the ASIC in FIG. 3 is stored in the RTL file 60B.

Returning to FIG. 2, the settings information receiving portion 202 performs a process for receiving information related to settings for the pin multiplex process designated by a user. That process is performed with the procedure as follows.

When the user operates the keyboard 12 or the mouse 13 to input a command, the setting information receiving portion 202 displays a window for designating settings of the pin multiplex process in the display 11. Here, the user designates the settings values they desire for the eight items shown in FIG. 6, designates FPGAs under which the blocks BK1 to BK6 will be classified, and designates the maximum number of pins used by each FPGA.

Thus, the settings information receiving portion 202, by recognizing the content of the user operation, receives the content of the user's desired settings. Based on those settings, the settings information receiving portion 202 generates a settings file 60C that expresses the settings value of each of the eight items in FIG. 6, and generates a settings file 60D that expresses the block BK belonging to each FPGA as shown in FIG. 7. Then, the settings files 60C and 60D are stored in the data management portion 20B. Also, with respect to an item in FIG. 6 for which the user has not designated a settings value, a default value corresponding to that item is expressed in the settings file 60C. The meaning of each item in FIG. 6 is described later.

The settings information verification portion 203, in the following manner for example, verifies whether or not there are any problems with the content of the settings designated by the user, i.e., the settings file 60C and the settings file 60D. Verification of the settings file 60C is performed by verifying whether or not no values that do not fall within a prescribed range are included in the settings values of the settings file 60C. Also, verification of the settings file 60D is performed by verifying whether or not one block BK is classified under more than one FPGA, or whether or not no block BK is not classified under any of the FPGAs.

When a problem has been found in the settings file 60C or 60D by the settings information verification portion 203, the message notification portion 204 notifies the user by, for example, displaying on the display 11 a message indicating the content of that problem and that the settings should be set again, or sending such a message via electronic mail.

The tentative synthesis portion 205, based on the pin information file 60A and the RTL file 60B input by the logic circuit data input portion 201, performs logic circuit synthesis using an existing logic circuit synthesis tool, i.e., performs logic circuit synthesis conventionally, not using the pin multiplex process according to the invention. Thus, it is possible to verify whether or not there are no errors in the pin information file 60A and the RTL file 60B that have been input. Verification is performed because if there is any error, it is not possible to successfully perform logic circuit synthesis even using a conventional method.

The multiplex database creation portion 206 creates an externally connected multiplex database 70A as shown in FIG. 8 and an internally connected multiplex database 70B as shown in FIG. 9.

The external connection multiplex database 70A is a database in which information is gathered that is related to ports that are a candidate for the pin multiplex process and are connected to external output ports among the ports indicated in the pin information file 60A that has been input by the logic circuit data input portion 201 (see FIGS. 4 and 5). On the other hand, an internal connection multiplex database 70B is a database in which information is gathered that is related to ports that are a candidate for the pin multiplex process and are connected to an input port of any block BK among the ports indicated in the pin information file 60A that has been input by the logic circuit data input portion 201.

Figure 10:
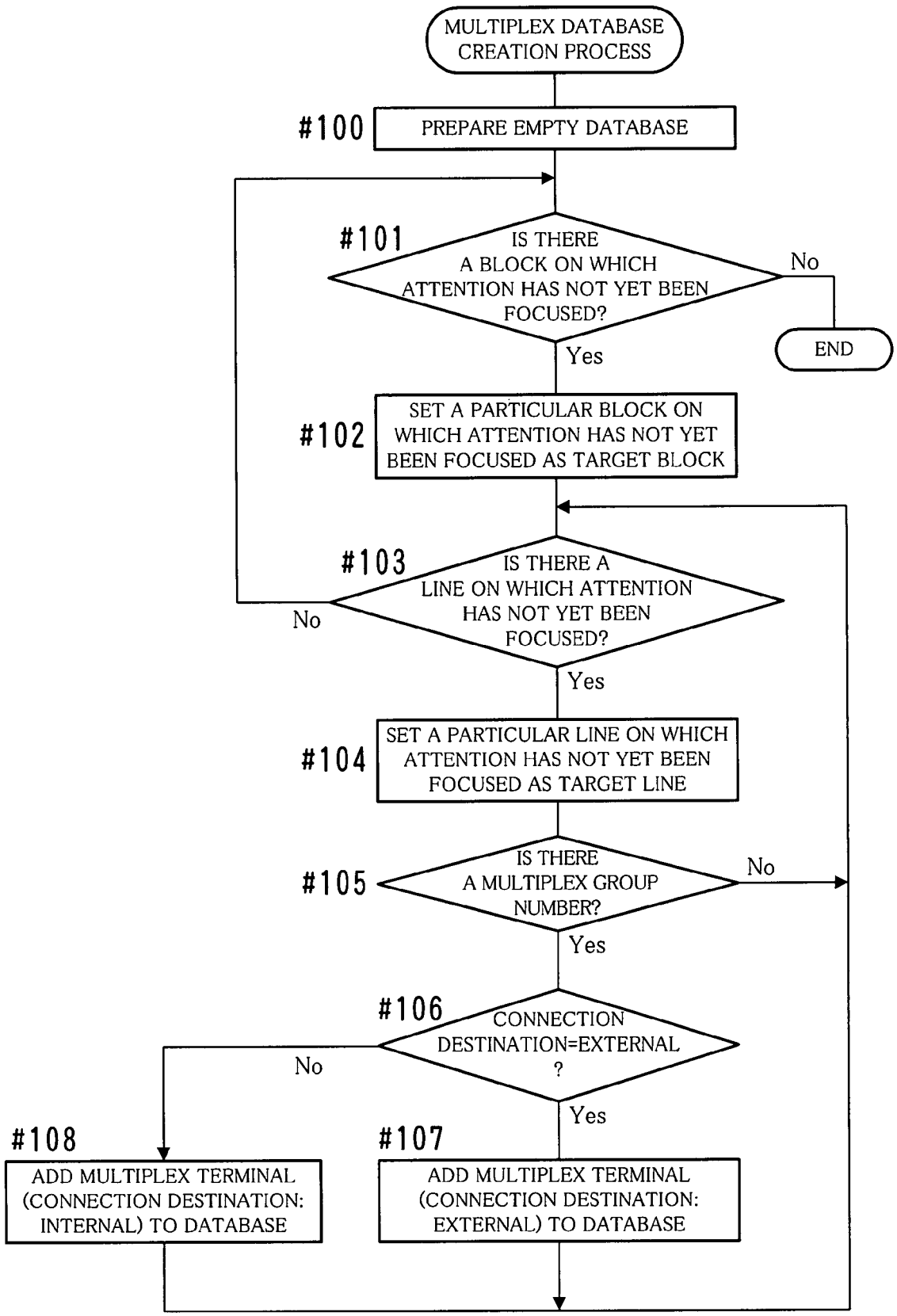
FIG. 10 is a flowchart that illustrates an example of the flow of a multiplex database creation process.

The multiplex database creation portion 206 creates the external connection multiplex database 70A and the internal connection multiplex database 70B with the procedure shown in FIG. 10.

In advance, a check is performed of the multiplex group number displayed in the "multiplex group" field of each record RO of each pin information table 80 of the pin information file 60A input by the logic circuit data input portion 201, and for each multiplex group number, an empty external connection multiplex database 70A and internal connection multiplex database 70B are prepared (#100 in FIG. 10).

Attention is focused on a pin information table 80 of any one block BK among the pin information tables 80 that constitute the pin information file 60A (#102). Attention is focused on any one row, i.e., any one record RO, in the pin information table 80 on which attention is focused (#104).

When any multiplex group number is indicated in the "multiplex group" field of the record RO on which attention is focused (Yes in #105), the type (class) of connection partner of the port for that record RO is checked, and according to the class of connection partner, the information for the port of that record RO is recorded in the following manner, in any of the external connection multiplex database 70A and the internal connection multiplex database 70B that were prepared in Step #100 and correspond to the multiplex group number of that record.

When "I/O" is indicated in the "connection source class" field of the record RO on which attention is focused, it is possible to determine that the connection partner of the port of that record RO is an external output port. In this case (Yes in #106), one new record is recorded in the external connection multiplex database 70A for the same multiplex group number, and the information for that port is written to that record (#107). Below, a record that has been recorded in the external connection multiplex database 70A is referred to as a "record RA".

When the "connection source class" field of the record RO on which attention is focused is empty, it is possible to determine that the connection partner of the port of that record RO is an input port of any block BK. In this case (No in #106), one new record is recorded in the internal connection multiplex database 70B for the same multiplex group number, and the information for that port is written to that record (#108).

Below, a record that has been recorded in the internal connection multiplex database 70B is referred to as a "record RB".

Incidentally, an output port may be, in for example the manner of the port "F3_ODTB" of the block BK3 in FIG. 3, connected to both an external output port and an input port of the block BK with a fork. Information of this sort of output port is recorded in both the external connection multiplex database 70A and the internal connection multiplex database 70B.

Whether or not the port for the record RO on which attention is focused is connected to both an external output port and an input port of the block BK, can be known by checking whether or not that both the condition that "I/O" is indicated in the "connection source class" field of the record RO on which attention is focused, and the condition that the name "Port_name" of that output port is indicated in the "connection source Port_name" of any other record RO are satisfied. If both conditions are satisfied, it is possible to determine that the port for the record RO on which attention is focused is connected to both an external output port and an input port of the block BK with a fork.

The records RA and RB that were presently recorded in the external connection multiplex database 70A or the internal connection multiplex database 70B are based on the record RO on which attention is presently focused (that is, on which attention was focused in Step #104).

On the other hand, when any multiplex group number is not indicated in the "multiplex group" field of the record RO on which attention is focused (No in #105), the process returns to Step #103, and if there is a record RO on which attention has not yet been focused even once in the pin information table 80 on which attention is being focused (Yes in #103), attention is refocused on that record RO (#104), and the process of above-described Steps #105 to #108 is executed for the port of that record RO. When attention has already been focused on all of the records RO (No in #103), the process returns to Step #101.

The process of Steps #102 to 108 described above is performed for each pin information table 80 of another block BK on which attention has not yet been focused. By performing the process of Steps #102 to #108 for the pin information table 80 of all of the blocks BK in this manner, the external connection multiplex database 70A and the internal connection multiplex database 70B are created.

When the multiplex database creation portion 206 performs the process of the flowchart described above for the pin information file 60A with the content shown in FIGS. 4 and 5, an external connection multiplex database 70A with the content shown in FIG. 8 is created on the connected clock unit basis, and an internal connection multiplex database 70B with the content shown in FIG. 9 is created on the connected clock unit basis. When there are a plurality of multiplex group numbers, an external connection multiplex database 70A and an internal connection multiplex database 70B that correspond to each multiplex group number are created.

The external connection multiplex database 70A and the internal connection multiplex database 70B thus created are stored and managed by the data management portion 20B.

As described later, the pin multiplex process is executed for a portion or all of the output ports displayed in the external connection multiplex database 70A or the internal connection multiplex database 70B. A signal output from a port for which that process has been executed is multiplexed by a multiplexer.

Returning to FIG. 2, the demultiplex database creation portion 207 creates a demultiplex database 70C as shown in FIG. 11. In the demultiplex database 70C, information is gathered about input ports that are a candidate for connection to an output port via a demultiplexer that demultiplexes the multiplexed signal.

Figure 12:
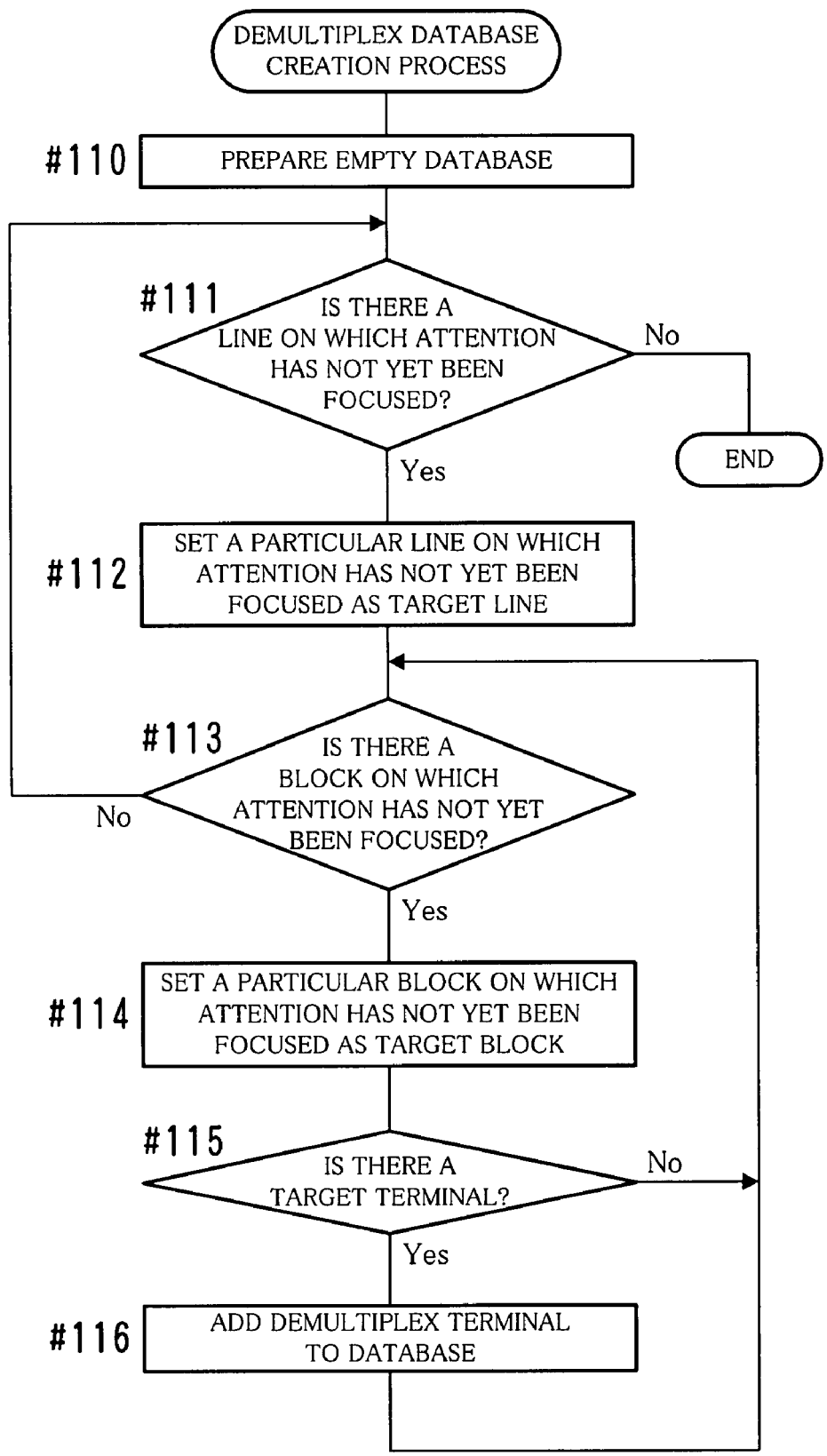
FIG. 12 is a flowchart that illustrates an example of the flow of a demultiplex database creation process.

The demultiplex database creation portion 207 creates the demultiplex database 70C with a procedure as shown in FIG. 12.

An empty demultiplex database 70C is prepared (#110 in FIG. 12). Attention is focused on any one of the records RB in the internal connection multiplex database 70B (see FIG. 9) (#112).

Attention is focused on any of the pin information tables 80 in the pin information file 60A (see FIGS. 4 and 5) (#114). A check is performed of, in the pin information table 80 on which attention is focused, whether or not a record RO of a port (an input port) that is the connection partner of the port (the output port) of the record RB on which attention is focused is not recorded (#115). That is, a search is performed for a record RO displaying the value (name) of the "Port_name" field of the record RB on which attention is focused in the "connection source Port_name" field.

When the search for such a record RO was successful (Yes in #115), one new record is recorded in the demultiplex database 70C, and the information of that input port is written to that record (#116). Below, a record that has been recorded in the demultiplex database 70C is referred to as a "record RC". The content of the record RC is based on the record RO.

Attention is sequentially focused on the pin information table 80 of the remaining blocks BK (#114), and the same process is performed (#115, #116).

Attention is sequentially focused also on the other records RB in the internal connection multiplex database 70B (#112), and the same process is performed (#113 to #116).

When the tentative synthesis portion 205 performs the process of the flowchart described above for the internal connection multiplex database 70B with the content shown in FIG. 9 with reference to the pin information file 60A with the content shown in FIGS. 4 and 5, a demultiplex database 70C with the content shown in FIG. 11 is created. The created demultiplex database 70C is stored and managed by the data management portion 20B.

When there are plurality of the internal connection multiplex databases 70B, i.e., when there are a plurality of the multiplex group numbers, by performing the process in FIG. 12 based on each internal connection multiplex database 70B, a demultiplex database 70C that corresponds to each of the multiplex group numbers is created.

Figure 13:
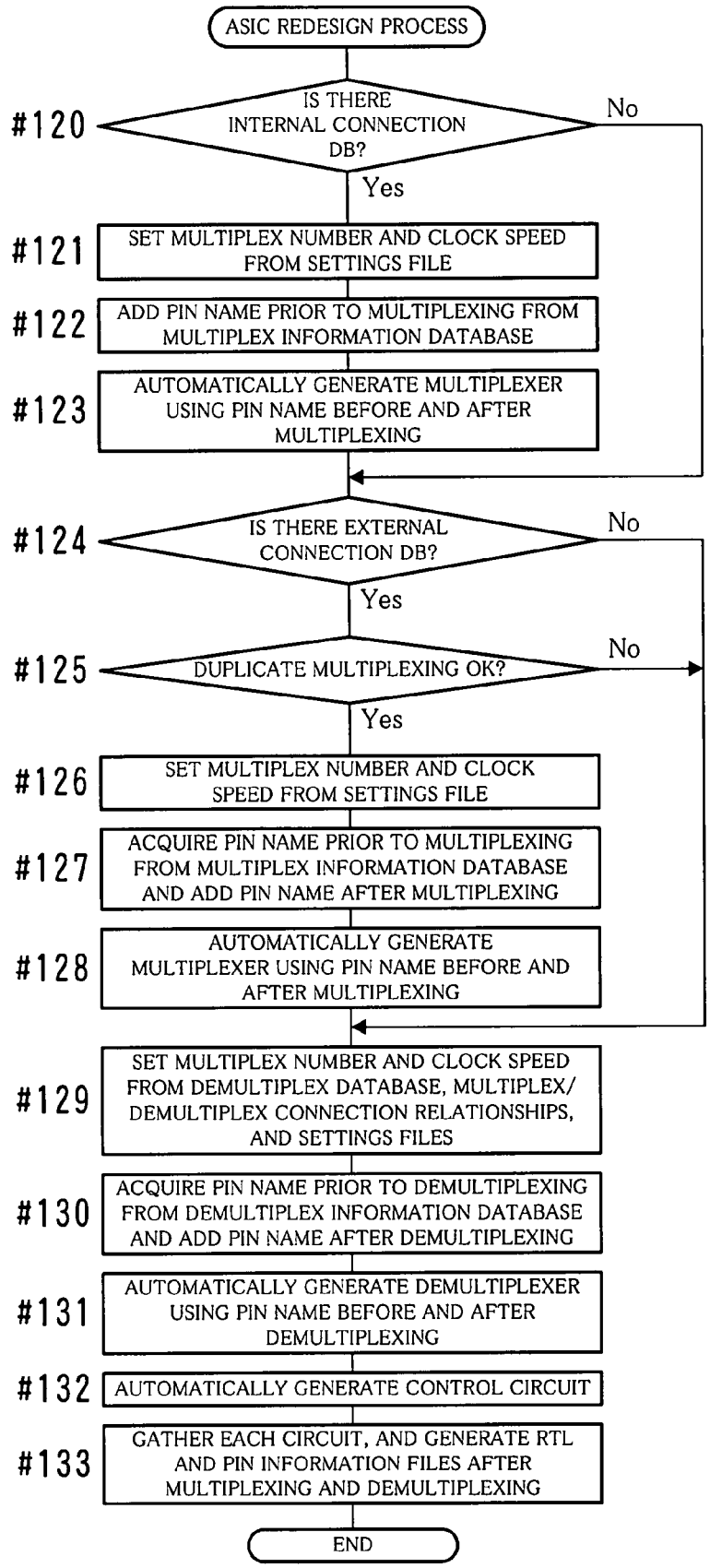
FIG. 13 is a flowchart that illustrates an example of the flow of an ASIC redesign process.

Returning to FIG. 2, the logic circuit configuration process portion 208 performs a process that configures an ASIC made up of a plurality of FPGAs (see FIGS. 14 to 20), based on the RTL file 60B, the settings file 60C, the settings file 60D, the external connection multiplex database 70A, the internal connection multiplex database 70B, and the demultiplex database 70C that are managed by the data management portion 20B. That process is executed with a procedure as shown in FIG. 13. Also, in the process shown in FIG. 13, the combination of output ports for which the pin multiplex process is performed, the output port for which the pin multiplex process is independently performed, the multiplexer and its disposition, the demultiplexer and its disposition, the control circuit that outputs the clock signal to the multiplexer and the demultiplexer and the disposition of that control circuit, and the like are obtained according to (Rule 1) to (Rule 8) below.

(Rule 1) When the fifth item (see FIG. 6) of the settings file 60C, "multiplex adding unconnected clock", is "0: do not perform", an output port that uses a different clock signal than the clock signal used by the connection partner is omitted from the pin multiplex process. Accordingly, that output port is not combined with any other output port, and the pin multiplex process is not executed for that port independently. When the fifth item is "1: perform", the pin multiplex process is performed for an output port regardless of whether or not that port uses the same clock signal as the clock signal used by the connection partner.

(Rule 2) When the sixth item of the settings file 60C, "judge connection destination", is "0: do not perform", it is possible to combine output ports regardless of whether or not the connection partner belongs to the same FPGA (that is, the connection partner is not judged). On the other hand, when the sixth item is "1: perform", combination of output ports is not possible unless each connection partner belongs to the same FPGA.

(Rule 3) When the eighth item of the settings file 60C, "multiplex straddling function block", is "0: do not perform", it is only possible to combine output ports that belong to the same block BK. On the other hand, when the eighth item is "1: perform", if the blocks BK are in the same FPGA, it is possible to combine output ports regardless of whether or not the output ports belong to the same block BK.

(Rule 4) When the seventh item of the settings file 60C, "duplicate multiplex of external output pin" is "0: do not perform", an output port connected to an external output port is excluded from the pin multiplex process. Accordingly, that output port is not combined with any other output port, and the pin multiplex process is not executed independently for that output port. When the seventh item is "1: perform", the pin multiplex process is performed independently for an output port connected to both an external output port and an input port of the block BK. However, an output port connected to only an external output port is excluded from the pin multiplex process when the seventh item is "1: perform", same as when the seventh item is "0: do not perform".

(Rule 5) When the connection partner of the output port is an input port belonging to the same FPGA as that output port, that output port is excluded from the pin multiplex process. Accordingly, that output port is not combined with any other output port, and the pin multiplex process is not executed independently for that output port.

(Rule 6) For one combination, a multiplexer is disposed that multiplexes the pins of the output ports of that combination. Also, for an output port for which pin multiplexing is independently performed, a multiplexer is disposed that multiplexes the pins of that output port. The multiplexers are disposed in the FPGA to which those output ports belong.

(Rule 7) A demultiplexer for demultiplexing a signal multiplexed by a multiplexer obtained based on (Rule 6) is disposed in the FPGA to which the block BK having the input port to which that signal is input belongs. When the sixth item of the settings file 60C, "judge connection destination", is "0: do not perform", demultiplexers may be disposed one by one in a plurality of FPGAs, with each demultiplexer corresponding to one multiplexer.

(Rule 8) After attention is focused on that output port and the input port that is the connection partner thereof, and a multiplexer and a demultiplexer are disposed (inserted), the clock signal input to the multiplexer connected to that output port and the clock signal input to the demultiplexer connected to that input port are set to be the same. That is, the clock signals input to the multiplexer and the demultiplexer respectively are set to be the same.

Here, the procedure of the process that configures the ASIC using the logic circuit configuration process portion 208 is described taking as an example a case in which the multiplex group number is one.

Before beginning the process in FIG. 13, the blocks BK of the functions possessed by the ASIC subject to the process are divided into some number of FPGAs based on the pin information file 60A, the settings file 60C, and the settings file 60D, using an existing logic division program.

In FIG. 13, when the internal connection multiplex database 70B is stored in the data management portion 20B (Yes in #120), the logic circuit configuration process portion 208 combines a plurality of the output ports, and performs a process that generates a multiplexer for performing multiplexing of the pins of these output ports (the pin multiplex process). Also, the logic circuit configuration process portion 208 performs a process that generates a multiplexer for performing the pin multiplex process independently for one of the output ports.

More specifically, a multiplex number and a clock speed of the multiplexer are determined based on the settings file 60C (#121). That is, the number of pins to be multiplexed and the clock frequency of the clock signal to be input to the multiplexer are determined.

The names of the combined output ports are acquired, and based on those names, according to a predetermined naming rule, the names of the output ports of the multiplexer for multiplexing of those output ports are determined (#122). Below, an output port of the multiplexer is referred to as a "multiplex output port". The name of a multiplex output port of the multiplexer that performs multiplexing of the pins of an independent output port is also determined according to the predetermined naming rule, based on the name of that output port.

A multiplexer for the pin multiplex process of the output port for each combination, and a multiplexer for the independent pin multiplex process of an output port, are generated using the determined name (#123).

Further, when an output port indicated in both the external connection multiplex database 70A and the internal connection multiplex database 70B is present, that is, when an output port connected to both an external output port and an input port of the block BK is present (Yes in #124), and the seventh item of the settings file 60C, "duplicate multiplex of external output pin", is "1: perform" (Yes in #125), the logic circuit configuration process portion 208 performs a process for producing a multiplexer for multiplexing the pins of that output port (#126 to #129).

That is, based on that settings file 60C, the multiplex number of that multiplexer and the clock speed of the clock signal to be used are determined (#126), the name of the multiplex output port of that multiplexer is determined (#127), and then that multiplexer is generated (#128).

Further, the logic circuit configuration process portion 208 performs a process that generates a demultiplexer corresponding to each multiplexer generated in Steps #123 and #128, based on the demultiplex database 70C (#129 to #131).

More specifically, the multiplex number and clock speed of each demultiplexer are determined (#129), the names of the input-side ports (referred to below as "multiplex input ports") of that demultiplexer are determined (#130), and then that demultiplexer is generated (#131). The same names as the multiplex output ports that are connection partners of the demultiplexer are used as the names of the multiplex input ports.

Further, the logic circuit configuration process portion 208 generates a control circuit for supplying a clock signal to the multiplexers and demultiplexers generated in Steps #123, 128, and 131 (#132).

Then, the logic circuit configuration process portion 208 disposes the multiplexers, the demultiplexers, and the control circuit generated in the manner described above, orders the connection relationships between ports, and the like, and generates data of the objective ASIC (see FIGS. 14 to 20) (#133). Specifically, the logic circuit configuration process portion 208 generates the pin information file 61A and the RTL file 61B of that ASIC.

Returning to FIG. 2, the results file output portion 209 outputs the pin information file 61A and the RTL file 61B generated by the logic circuit configuration process portion 208 to outside of the computer 1.

Here, the sort of ASIC to which the ASIC shown in FIG. 3 is converted according to the settings values indicated in the settings file 60C illustrated in FIG. 6 is described with reference to the circuit diagrams shown in FIGS. 14 to 20.

In FIGS. 14 to 20, "S1_A", "S1_B", ..., "S6_B" indicate one or a plurality of lines (signal lines) through which passes a signal output from each pin of an output port of a block BK, or a signal input to each pin of an input port of the block BK. More specifically, one line is shown in the case of an output port or input port configured with one pin, and a line group that corresponds to each pin is shown in the case of an output port or input port configured with a plurality of pins. The same reference numeral may indicate a plurality of lines or line groups. For example, "S1_A" indicates a line group from an output port of the block BK1 and a line group to an input port of the block BK3, and this means that a signal that has been output from that output port is input to that input port, passing through both line groups and straddling FPGAs (that is, belonging to an FPGA other than the FPGA to which that output port belongs).

Also, in FIGS. 14 to 20, due to the size of the paper face, the names of each port provided in each block BK1 to BK6 are omitted. These names are the same as the names shown in FIG. 3, so it is possible to refer to FIG. 3 for the names as necessary. The reference numerals of the lines through which clock signals pass are also omitted.

Figure 14:
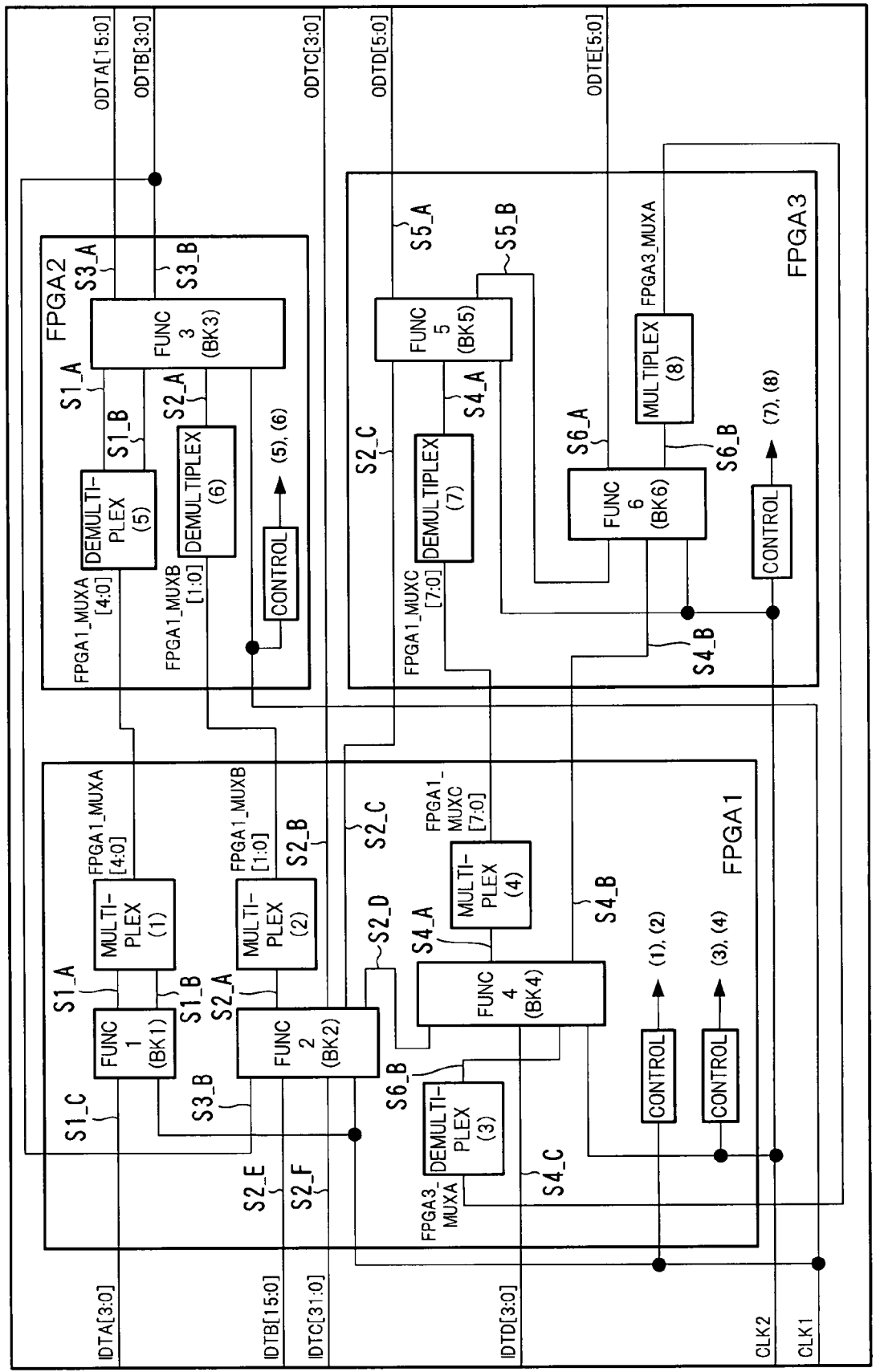
FIG. 14 shows an example of a redesigned ASIC.

When all of the settings values of the settings file 60C are default values, an ASIC as shown in FIG. 14 is obtained.

Figure 21:
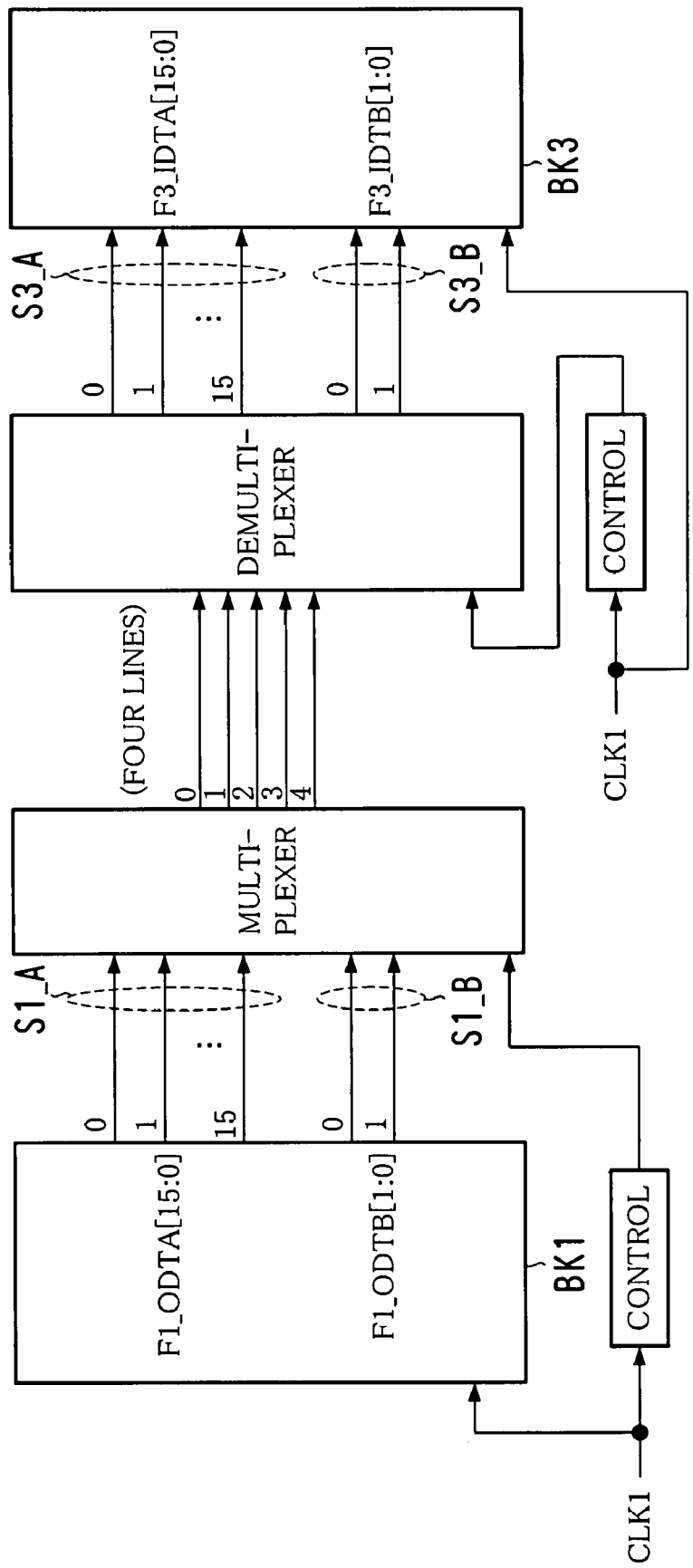
FIG. 21 shows an example of the relationship of ports, pins, and lines after a multiplexer and a demultiplexer have been inserted.

In this ASIC, as shown in FIG. 21, for example, signals that have been output from each of 16 pins of the output ports of "F1_ODTA" and signals that have been output from each of two pins of the output ports of "F1_ODTA" are multiplexed by a multiplexer to a maximum of four lines. Here, because the signals from a total of 18 pins are multiplexed to four lines, the number of pins of the multiplex output ports of that multiplexer is five. The multiplexed signals are demultiplexed when input to a demultiplexer. Then, each of the demultiplexed signals is input to an objective input port.

Signals output from other output ports are likewise multiplexed and demultiplexed by a multiplexer and a demultiplexer as necessary, and input to objective input ports.

Figure 15:
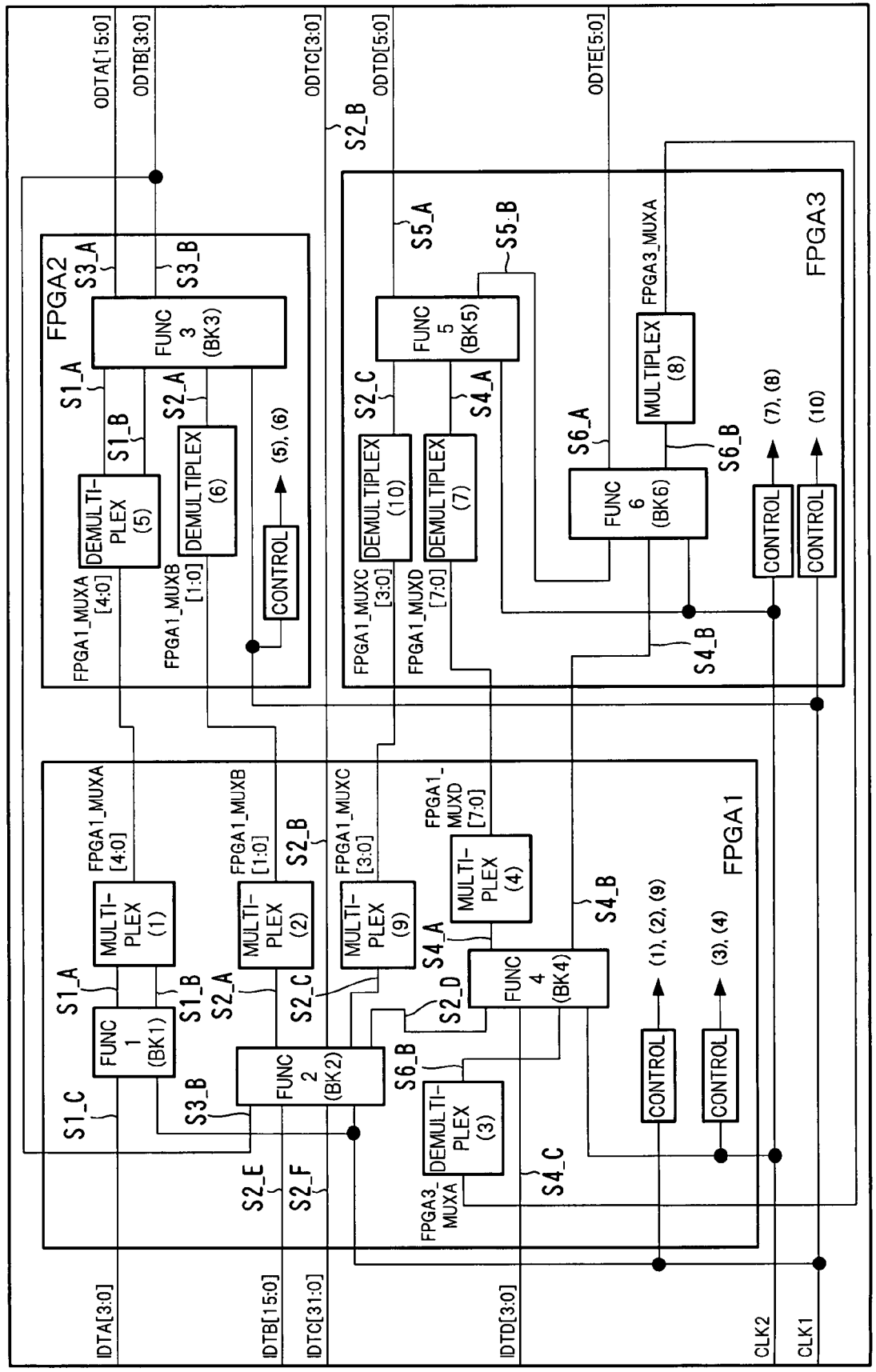
FIG. 15 shows an example of a redesigned ASIC.

When the fifth item (see FIG. 6) of the settings file 60C, "multiplex adding unconnected clock", is "1: perform", according to (Rule 1) described above, the pin multiplex process is performed for an output port even if that output port uses a different clock signal than the clock signal used by the connection partner. FPGAs as shown in FIG. 15 are obtained when, due to the fifth item being "1: perform", the output port "FT2_ODTC" that uses a different clock signal than the clock signal used by the connection partner "F5_IDTA" is selected as the subject of the pin multiplex process, and "1: perform" is selected for the sixth item, and the set value of both items is the default value.

Figure 16:
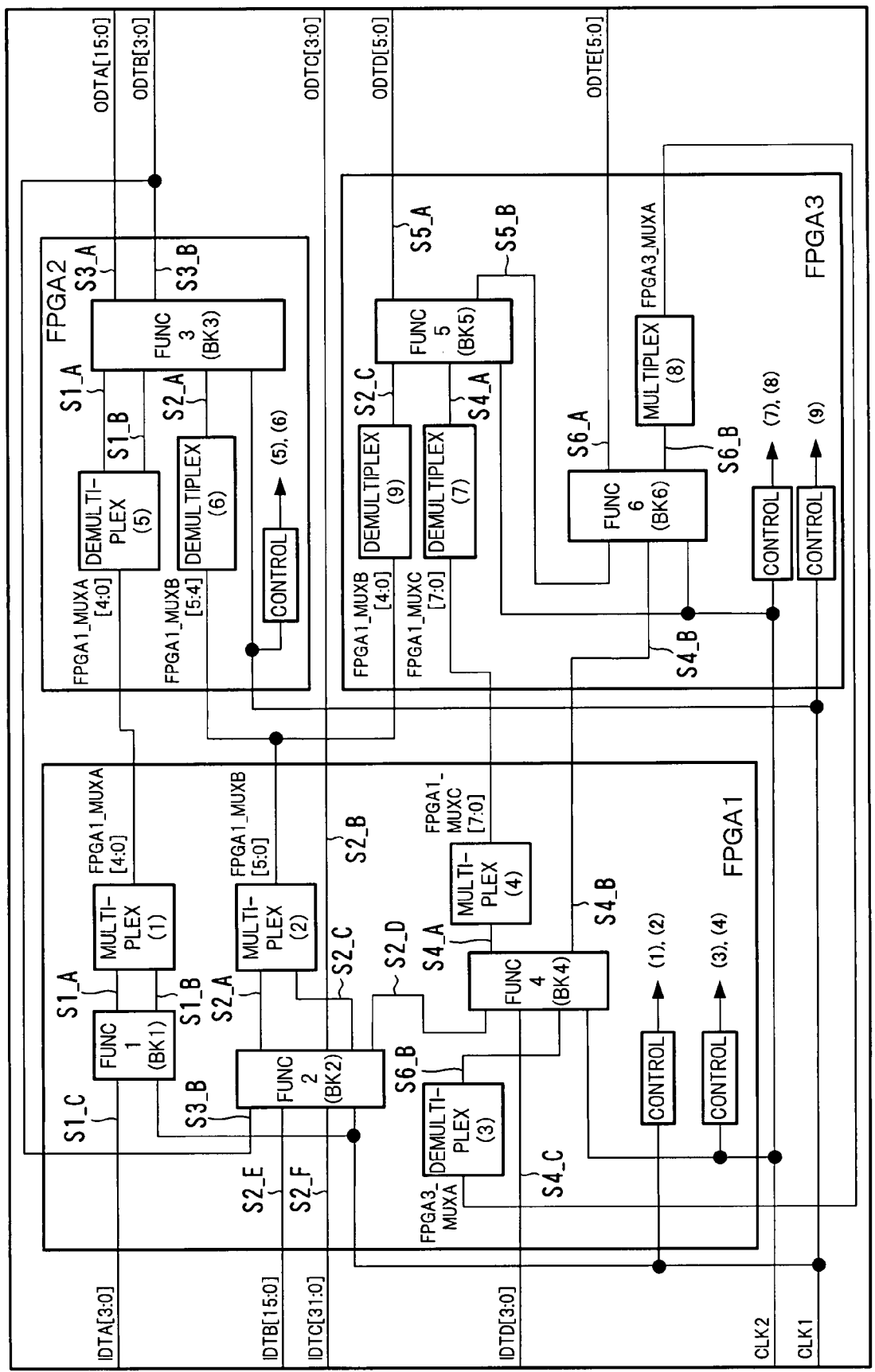
FIG. 16 shows an example of a redesigned ASIC.

When the sixth item of the settings values of the settings file 60C, "judge connection destination", is "0: do not perform", according to (Rule 2) described above, even when the FPGAs to which the connection partners of each of a plurality of output ports belong are different, it is possible to combine those output ports. FPGAs as shown in FIG. 16 are obtained when, due to the sixth item being "0: do not perform" and the fifth item being "1: perform", the output port "F2_ODTA" and the output port "F2_ODTC" are combined, and the settings values for items other than the fifth and sixth items are the default values.

Figure 17:
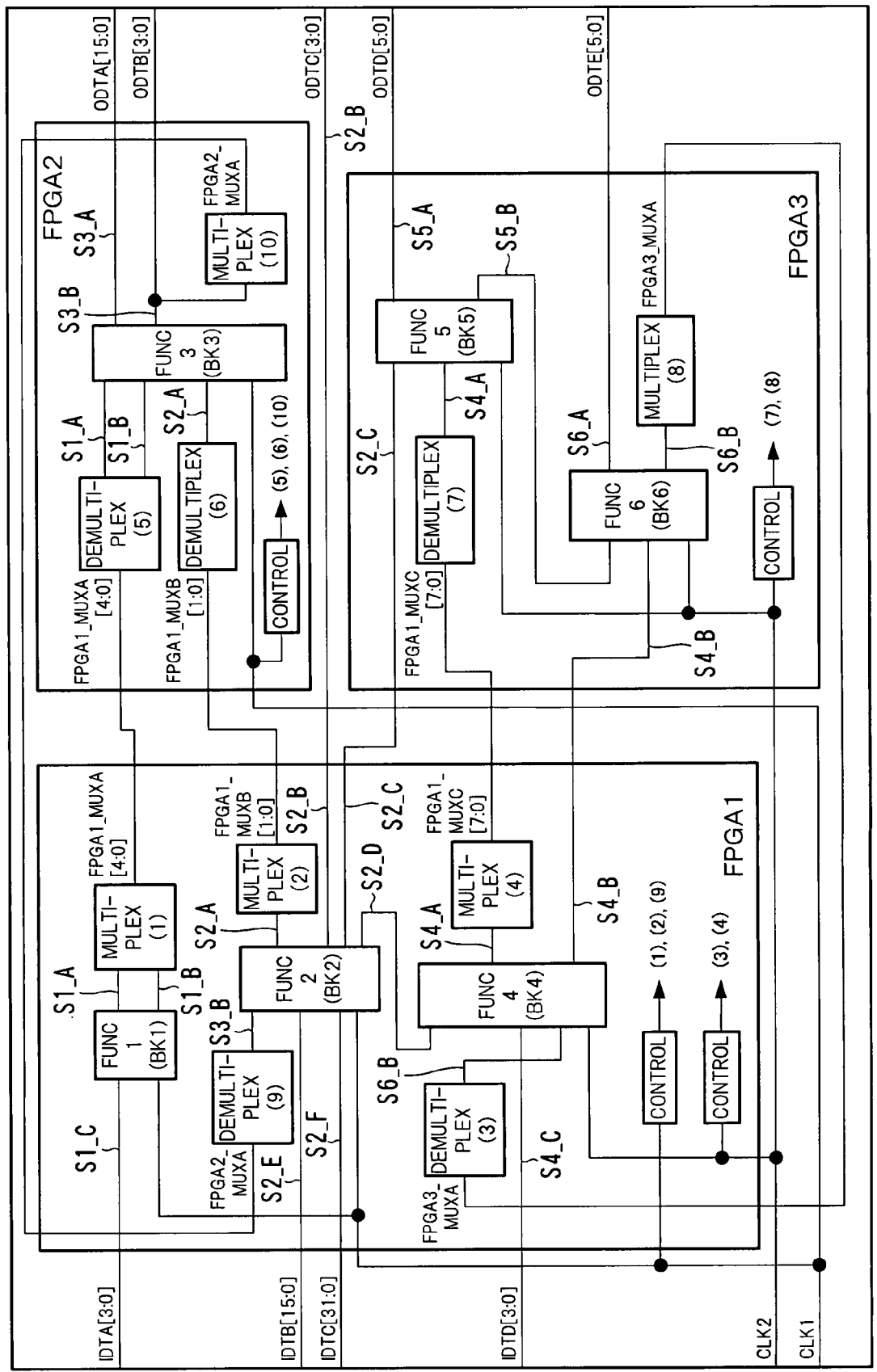
FIG. 17 shows an example of a redesigned ASIC.

When the seventh item of the settings values of the settings file 60C, "duplicate multiplex of external output pin", is "1: perform", according to (Rule 4) described above, the pin multiplex process is performed independently for an output port connected to both an external output port and an input port of the block BK. FPGAs as shown in FIG. 17 are obtained when the seventh item is "1: perform", and the settings values for the other items are the default values.

Figure 18:
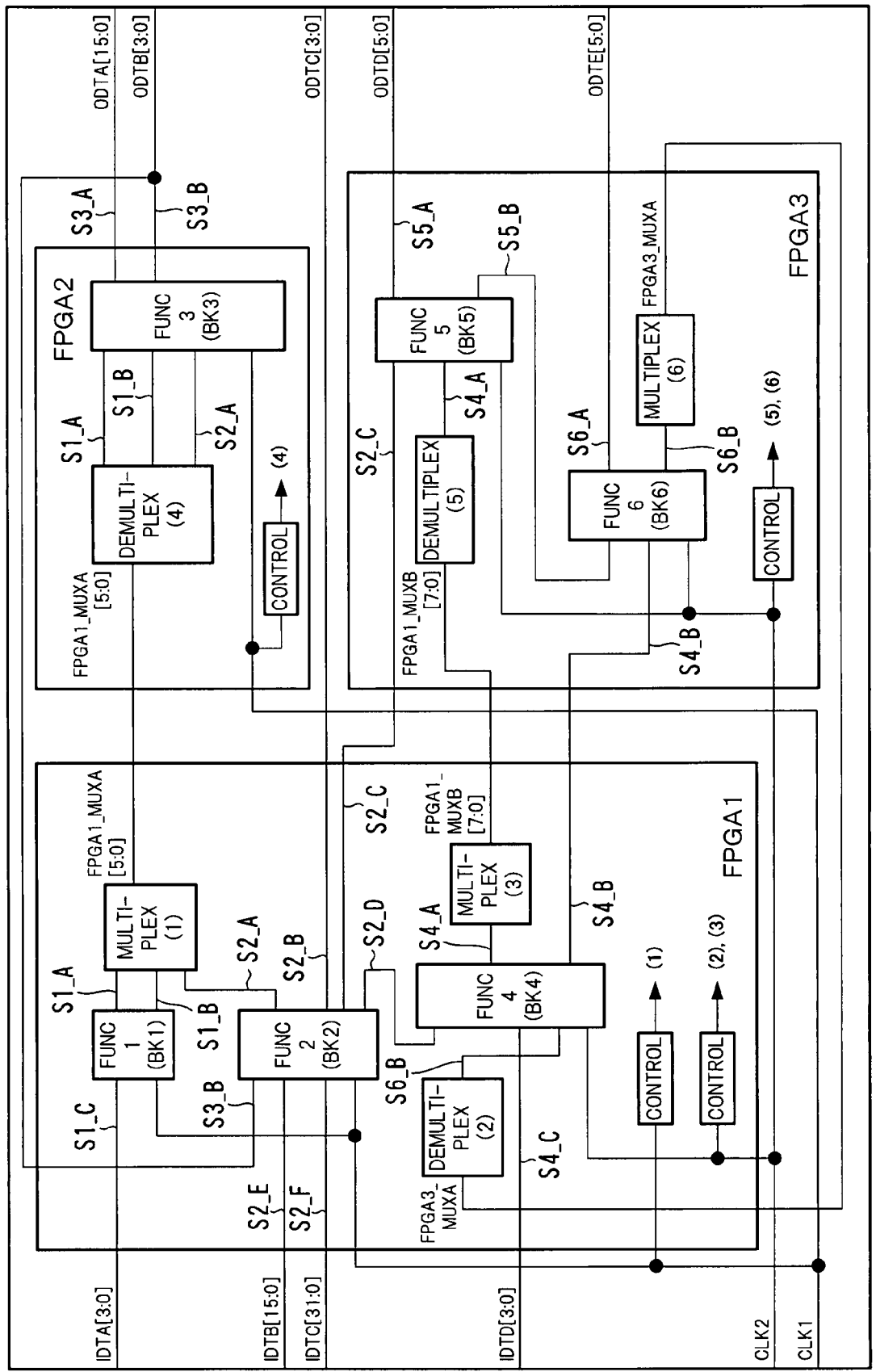
FIG. 18 shows an example of a redesigned ASIC.

When the eighth item of the settings values of the settings file 60C, "multiplex straddling function block", is "1: perform", according to (Rule 3) described above, if the blocks BK are in the same FPGA, it is possible to combine output ports that belong to different blocks BK. FPGAs as shown in FIG. 18 are obtained when, due to the eighth item being "1: perform", the output ports "F1_ODTA", "F1_ODTB", and "F2_ODTA" are combined, and the settings values for the other items are the default values.

Incidentally, as described above with reference to FIGS. 5 and 6, it is possible to classify the output ports of the original ASIC into a plurality of multiplex groups. When it is desired that a predetermined number of output ports are not combined in the same group, the record RO of each output port may be set such that a different multiplex group number is given to each output port.

Figure 19:
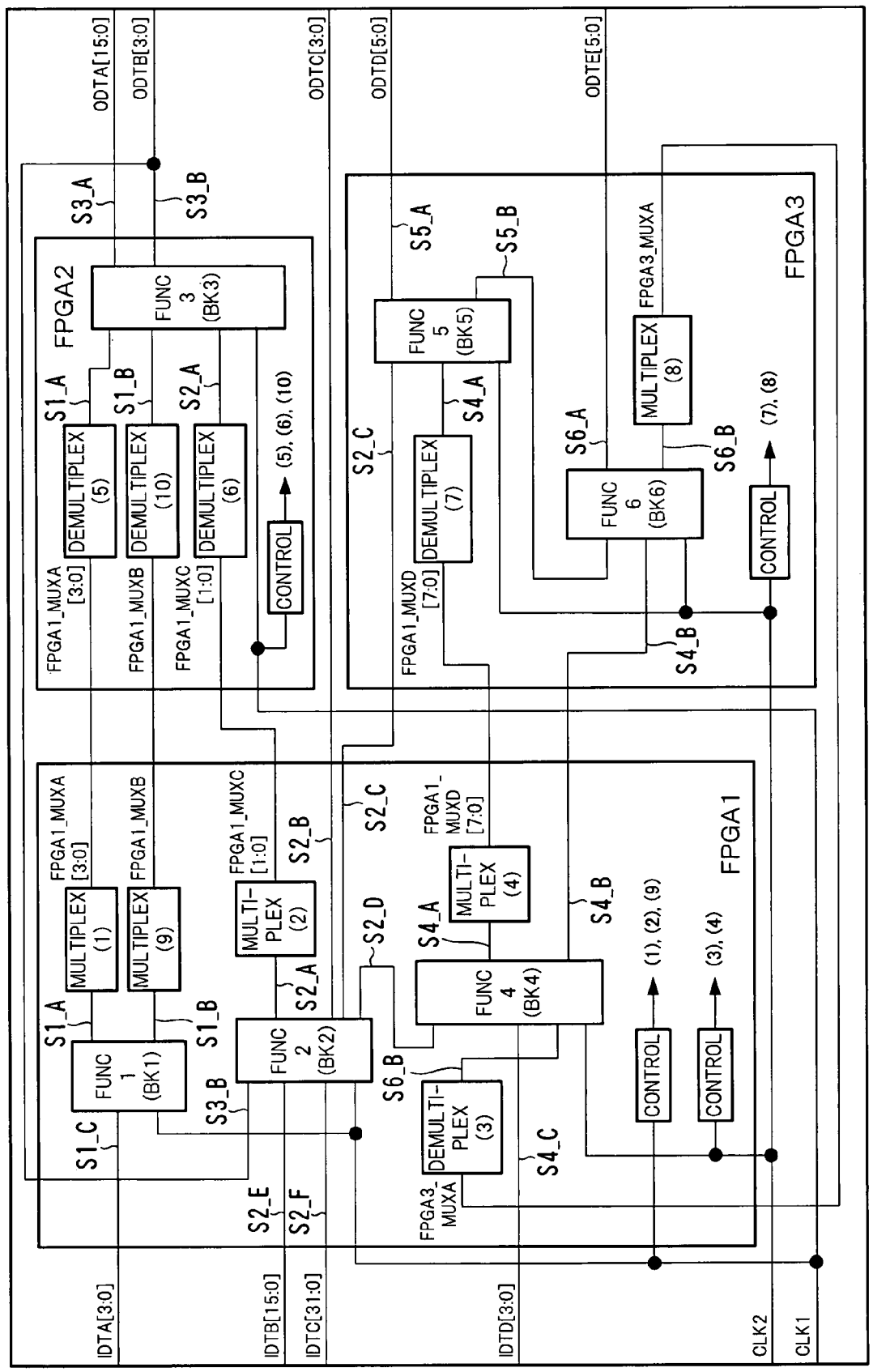
FIG. 19 shows an example of a redesigned ASIC.
Figure 20:
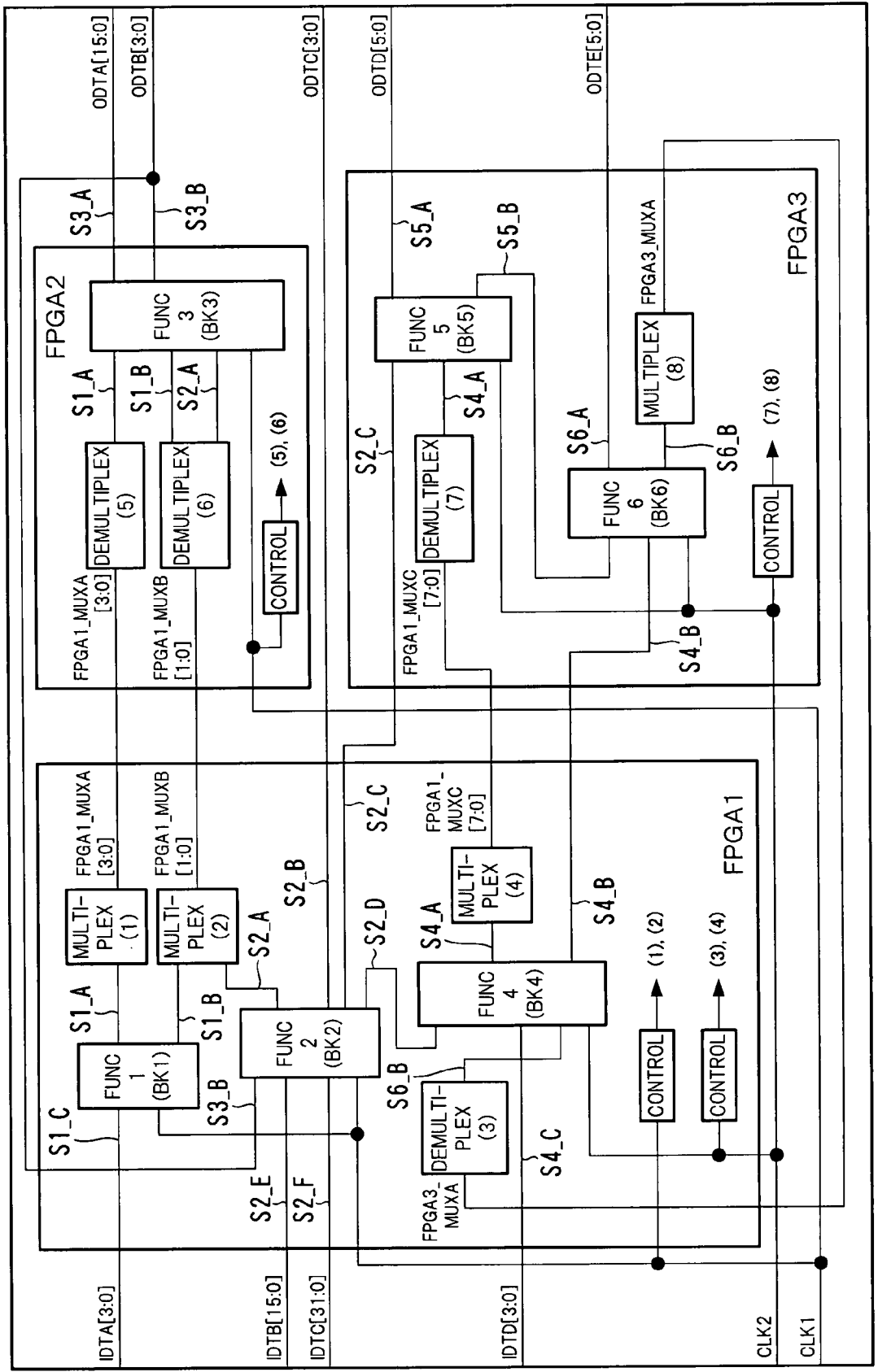
FIG. 20 shows an example of a redesigned ASIC.

FPGAs as shown in FIG. 19 are obtained when the pin information table 801 of the block BK1 is set to the content shown in FIG. 22 instead of the content shown in FIG. 4A, i.e., when the output port "F1_ODTA" and the output port "F1_ODTB" are classified in separate multiplex groups, and all of the settings values of the settings file 60C are the default values. Also, FPGAs as shown in FIG. 20 are obtained when the eighth item, "multiplex straddling function block", is "1: perform", and the settings values of the other items are the default values.

Figure 23:
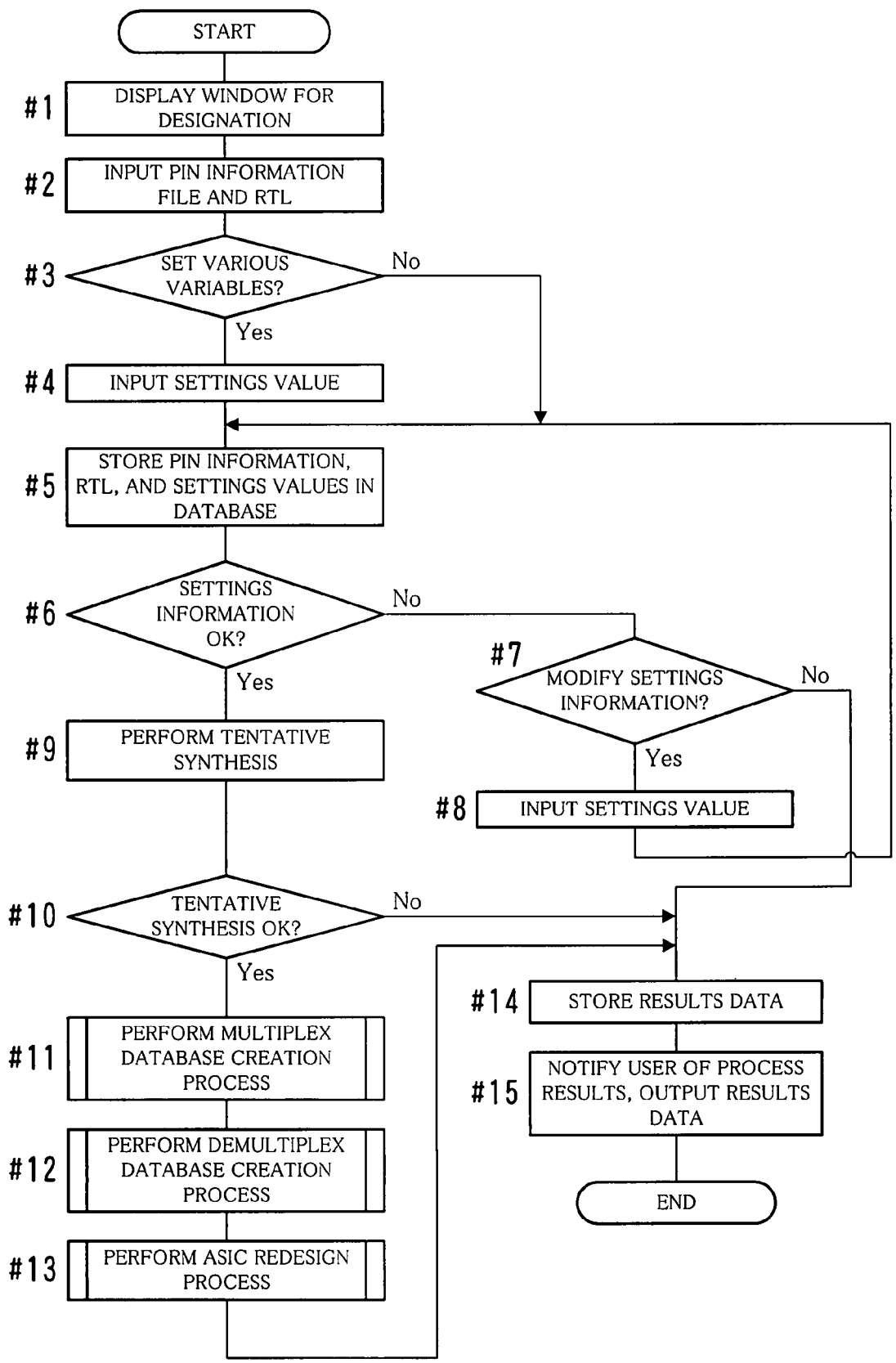
FIG. 23 is a flowchart that illustrates an example of the flow of the overall process in a computer.

Next is a description of the overall flow of a process of the computer 1 when ASIC redesign is performed, with reference to the flowchart in FIG. 23.

The computer 1 designates the pin information file 60A and the RTL file 60B of the ASIC to be converted (redesigned), designates each item shown in FIG. 6 as necessary, designates the classification to an FPGA of the blocks BK1 to BK6, and displays a window for designating the multiplex group numbers as necessary (#1).

The pin information file 60A and the RTL file 60B designated by the user are input (#2). When the user has designated a value other than the default value as the set value of any item shown in FIG. 6 (Yes in #3), that value is also input (#4).

Based on the content input in Steps #2 and #4 and the default values, the pin information file 60A, the RTL file 60B, the settings file 60C, and the settings file 60D are appropriately adjusted, and these files are stored in the data management portion 20B (#5).

Verification is performed of whether or not there is a problem such as a defect in the settings file 60C and the settings file 60D (#6). When there is a problem (No in #6), a message is output that prompts the user to again designate a settings value or the like. When the user has again designated a settings value or the like (Yes in #7), the computer 1 inputs again the designated value (#8), and the settings file 60C or the settings file 60D is again stored in the data management portion 20B (#5).

An ASIC is generated (tentatively synthesized) with a conventional method, using the pin information file 60A and the RTL file 60B (#9). Thus, it is possible to confirm whether or not there are no problems in the pin information file 60A and the RTL file 60B.

When there are no problems (Yes in #10), the external connection multiplex database 70A and the internal connection multiplex database 70B are generated (#11), and also the demultiplex database 70C is generated (#12). The procedure of the process that generates the external connection multiplex database 70A and the internal connection multiplex database 70B is as described above with reference to FIG. 10. The procedure of the process that generates the demultiplex database 70C is as described above with reference to FIG. 12.

Redesign of the ASIC is performed to generate the pin information file 61A and the RTL file 61B (#13). The procedure of these processes is as described above with reference to FIG. 13. As described above with reference to FIGS. 14 to 20, a variety of redesign results are obtained according to the multiplex groups indicated in the pin information file 60A and the settings values of each item (see FIG. 6) indicated in the settings file 60C.

Then, the pin information file 61A and the RTL file 61B, i.e., the results of redesign, are stored in the RTL file 60B (#14), and the user is notified of the process results or the process results are output (#15).

According to this embodiment, when an original logic circuit is redesigned by dividing the original logic circuit into a plurality of FPGAs, it is possible to reduce the number of pins used in comparison to the conventional technology. Further, according to the purpose of redesign or the like, it is possible to modify the content of the settings file 60C to appropriately modify the subject of multiplexing and the combinations in the multiplexing.

All or a portion of the configuration of the computer 1, the content of the processes, the order of processes, the configuration of files, the configuration of databases, and the like can be appropriately modified in accordance with the gist of the invention.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A logic circuit redesign program used for a computer that performs redesign of a logic circuit comprising a plurality of blocks, the logic circuit redesign program allowing the computer to:
execute an information acquisition process that acquires pin information related to pins used in respective ports provided in each of the blocks and connection information that indicates connection relationships between the ports;
execute a multiplexer disposition process that, based on the pin information and the connection information, classifies a plurality of pins of output ports of a block into a number of pin groups that is less than the number of pins, and disposes a multiplexer having a function to multiplex a signal output from each pin classified in the same pin group; and
execute a demultiplexer disposition process that, based on the pin information and the connection information, disposes a demultiplexer having a function to demultiplex signals that have been output from output ports of a block and multiplexed by the multiplexer, and a function to output each of the demultiplexed signals to input ports of respective input destination blocks.

2. The logic circuit redesign program according to claim 1, wherein the logic circuit redesign program allows the computer to execute the multiplexer disposition process such that, when the signals output from the respective pins of the plurality of output ports are multiplexed by a single multiplexer, multiplexing is performed by the multiplexer on the signals output from the pins of the output ports that have the same input destination block of the signals output.

3. The logic circuit redesign program according to claim 1, wherein the logic circuit redesign program:
allows the computer to execute a block classification process that classifies each block under any of a plurality of FPGAs (Field Programmable Gate Arrays); and
allows the computer to execute the multiplexer disposition process such that multiplexing is performed by the multiplexer only on signals output from the pins of the output ports of a block of an FPGA different than the FPGA of the input destination block of the signals output.

4. The logic circuit redesign program according to claim 1, wherein the logic circuit redesign program allows the computer to execute the multiplexer disposition process such that, when the signals output from the respective pins of the plurality of output ports are multiplexed by a single multiplexer, multiplexing is performed by the multiplexer on the signals output from the pins of the output ports that have the same clock signal input to the input destination block of the signals output.

5. The logic circuit redesign program according to claim 1, wherein the logic circuit redesign program allows the computer to execute the demultiplexer disposition process such that the same clock signal is input to the demultiplexer as the clock signal of the multiplexer that is the output source of the multiplexed signals to be demultiplexed by the demultiplexer.

6. The logic circuit redesign program according to claim 1, wherein the logic circuit redesign program:
allows the computer to execute a process that classifies the output ports of a block under any of a plurality of multiplex groups; and
allows the computer to execute the multiplexer disposition process for each output port classified in the same multiplex group.

7. A logic circuit redesign apparatus that performs redesign of a logic circuit comprising a plurality of blocks, the logic circuit redesign apparatus comprising:
an information acquisition portion that acquires pin information related to pins used in respective ports provided in each of the blocks and connection information that indicates connection relationships between the ports;
a multiplexer disposition portion that, based on the pin information and the connection information, classifies a plurality of pins of output ports of a block into a number of pin groups that is less than the number of pins, and disposes a multiplexer having a function to multiplex a signal output from each pin classified in the same pin group; and
a demultiplexer disposition portion that, based on the pin information and the connection information, disposes a demultiplexer having a function to demultiplex signals that have been output from output ports of a block and multiplexed by the multiplexer, and a function to output each of the demultiplexed signals to input ports of respective input destination blocks.

8. A logic circuit redesign method for performing redesign of a logic circuit comprising a plurality of blocks, the logic circuit redesign method allowing a computer to:

execute an information acquisition process that acquires pin information related to pins used in respective ports provided in each of the blocks and connection information that indicates connection relationships between the ports;

execute a multiplexer disposition process that, based on the pin information and the connection information, classifies a plurality of pins of output ports of a block into a number of pin groups that is less than the number of pins, and disposes a multiplexer having a function to multiplex a signal output from each pin classified in the same pin group; and execute a demultiplexer disposition process that, based on the pin information and the connection information, disposes a demultiplexer having a function to demultiplex signals that have been output from output ports of a block and multiplexed by the multiplexer, and a function to output each of the demultiplexed signals to input ports of respective input destination blocks;

thus performing redesign of the logic circuit.

* * * * *